(12) United States Patent
Saito

(10) Patent No.: US 9,584,748 B2
(45) Date of Patent: Feb. 28, 2017

(54) SOLID-STATE IMAGING APPARATUS AND IMAGING DEVICE

(71) Applicant: OLYMPUS CORPORATION, Tokyo (JP)

(72) Inventor: Masashi Saito, Tokyo (JP)

(73) Assignee: OLYMPUS CORPORATION, Tokyo (JP)

( * ) Notice: Subject to any disclaimer, the term of this patent is extended or adjusted under 35 U.S.C. 154(b) by 91 days.

(21) Appl. No.: 14/717,710

(22) Filed: May 20, 2015

(65) Prior Publication Data

US 2015/0341581 A1 Nov. 26, 2015

(30) Foreign Application Priority Data

May 22, 2014 (JP) .................................. 2014-106347

(51) Int. Cl.

| | |
|---|---|
| *H03M 1/56* | (2006.01) |
| *H04N 5/378* | (2011.01) |
| *H04N 5/376* | (2011.01) |
| *H04N 5/3745* | (2011.01) |
| *H03M 1/06* | (2006.01) |
| *H03M 1/08* | (2006.01) |
| *H03M 1/12* | (2006.01) |

(52) U.S. Cl.
CPC ........... *H04N 5/378* (2013.01); *H03M 1/0624* (2013.01); *H04N 5/3765* (2013.01); *H04N 5/37457* (2013.01); *H03M 1/0845* (2013.01); *H03M 1/123* (2013.01); *H03M 1/56* (2013.01)

(58) Field of Classification Search
CPC .. H04N 5/378; H04N 5/37457; H04N 5/3765; H03M 1/0624; H03M 1/0845
See application file for complete search history.

(56) References Cited

U.S. PATENT DOCUMENTS

| 2013/0154705 A1* | 6/2013 | Sakurai ..................... H03K 3/86 327/179 |
| 2013/0215286 A1* | 8/2013 | Ohya ................. H04N 5/37455 348/222.1 |
| 2015/0281619 A1* | 10/2015 | Tanaka ................... H04N 5/335 348/322 |

FOREIGN PATENT DOCUMENTS

| JP | 2011-055196 | 3/2011 |
| JP | 2012-039386 | 2/2012 |

OTHER PUBLICATIONS

ITE Technical Report vol. 37, No. 29, Jul. 2013 Daisuke Uchida et al., Low-Power-Consumption Driving in Single-Slope ADC with Multi-phase TDC (partial translation).

* cited by examiner

*Primary Examiner* — Tony Ko
(74) *Attorney, Agent, or Firm* — Pillsbury Winthrop Shaw Pittman, LLP

(57) ABSTRACT

A solid-state imaging apparatus includes an imaging section in which a plurality of pixels, each of which has a photoelectric conversion element, are disposed in a matrix; a clock generation section; a reference signal generation section configured to generate a reference signal whose amplitude increases or decreases with the passage of time; a comparison section disposed corresponding to a column in an array of the plurality of pixels; a latch section disposed corresponding to the comparison section and configured to latch logic states of the plurality of phase signals; and a latch control section disposed corresponding to the comparison section, wherein the comparison section includes a differential amplifier, a current output element, and a third transistor, and wherein the comparison section outputs a second comparison signal based on the current output from the current output element after the second timing.

16 Claims, 16 Drawing Sheets

SOLID-STATE IMAGING APPARATUS AND IMAGING DEVICE

BACKGROUND OF THE INVENTION

Field of the Invention

The present invention relates to a solid-state imaging apparatus and an imaging device. Priority is claimed on Japanese Patent Application No. 2014-106347, filed May 22, 2014, the content of which is incorporated herein by reference.

Description of Related Art

As an example of a solid-state imaging apparatus using a time to digital converter single slope (tdcSS) type AD conversion circuit obtained by combining a time to digital converter (TDC) type AD conversion circuit with a single slope (SS) type AD conversion circuit, a configuration disclosed in the publication of Japanese Unexamined Patent Application, First Publication No. 2011-55196 is known. FIG. 13 shows part of the configuration of the tdcSS type AD conversion circuit in accordance with a first conventional example. Hereinafter, the configuration and the operation of the circuit shown in FIG. 13 will be described.

The circuit shown in FIG. 13 has a comparison section 1031, a latch section 1033, a count section 1034, and a buffer circuit BUF. The comparison section 1031 has a voltage comparator COMP configured to receive inputs of an analog signal Signal serving as an AD conversion target and a reference signal Ramp which decreases with the passage of time and output a comparison signal CO based on a result of comparing the analog signal Signal with the reference signal Ramp. The latch section 1033 has latch circuits L_0 to L_7 configured to latch logic states of a plurality of phase signals CK[0] to CK[7] having different phases from each other. The count section 1034 has a counter circuit CNT configured to perform a count operation based on the phase signal CK[7] output from the latch circuit L_7. A control signal RST is a signal used for performing a reset operation of the counter circuit CNT.

In the comparison section 1031, a time interval (a magnitude of a time axis direction) based on an amplitude of the analog signal Signal is generated. The buffer circuit BUF is an inverting buffer circuit configured to invert an input signal and output the inverted input signal.

The latch circuits L_0 to L_7 constituting the latch section 1033 are in an enable (valid or active) state and output the input phase signals CK[0] to CK[7] without change when a control signal Hold from the buffer circuit BUF is in a High (H) state. In addition, the latch circuits L_0 to L_7 are in a disable (invalid or hold) state when the control signal Hold from the buffer circuit BUF is transitioned from the H state to the Low (L) state and latch logic states of the input phase signals CK[0] to CK[7].

Next, an operation of the circuit according to the first conventional example will be described. FIG. 14 shows waveforms of the reference signal Ramp, the analog signal Signal, a start pulse StartP, the phase signals CK[0] to CK[7], the comparison signal CO, the control signal Hold from the buffer circuit BUF, and output signals Q0 to Q7 of the latch circuits L_0 to L_7 of the latch section 1033. The horizontal direction of FIG. 14 represents time and the vertical direction of FIG. 14 represents a voltage.

First, the generation of the phase signals CK[0] to CK[7] starts at the first timing related to the comparison start in the comparison section 1031 and the generated phase signals CK[0] to CK[7] are input to the latch circuits L_0 to L_7 of the latch section 1033. Because the control signal Hold from the buffer circuit BUF is in the H state, the latch circuits L_0 to L_7 are in the enable state and the phase signals CK[0] to CK[7] are output without change.

The count section 1034 performs a count operation based on the phase signal CK[7] output from the latch circuit L_7 of the latch section 1033. In this count operation, a count value increases or decreases at a rising or falling timing of the phase signal CK[7]. The comparison signal CO from the comparison section 1031 is inverted at a second timing at which a voltage of the analog signal Signal substantially coincides with that of the reference signal Ramp. After the comparison signal CO is buffered by the buffer circuit BUF, the control signal Hold from the buffer circuit BUF is in the L state at the third timing.

Thereby, the latch circuits L_0 to L_7 are in the disable state. At this time, the logic states of the phase signal CK[0] to CK[7] are latched in the latch circuits L_0 to L_7. When the latch circuit L_7 stops the operation, the count section 1034 latches the count value. Digital data corresponding to the analog signal Signal is obtained by the logic state latched by the latch section 1033 and the count value latched by the count section 1034.

Further, a configuration disclosed in the publication of Japanese Unexamined Patent Application, First Publication No. 2012-39386 has been proposed. FIG. 15 shows part of the configuration of a tdcSS type AD conversion circuit according to a second conventional example. Hereinafter, a configuration and an operation of the circuit shown in FIG. 15 will be described.

The circuit shown in FIG. 15 has a comparison section 1031, a latch control section 1032, a latch section 1033, and a count section 1034. The comparison section 1031 and the count section 1034 are the same as the comparison section 1031 and the count section 1034 shown in FIG. 13.

The latch control section 1032 has an inverting delay circuit DLY and an AND circuit AND1 and generates a control signal for controlling the operation of the latch section 1033. A comparison signal CO is input from the comparison section 1031 to the inverting delay circuit DLY. The inverting delay circuit DLY inverts the comparison signal CO and outputs a delayed comparison signal xCO_D. The inverted comparison signal xCO_D from the inverting delay circuit DLY and the comparison signal CO from the comparison section 1031 are input to the AND circuit AND1. The AND circuit AND1 outputs a control signal Hold_L obtained by taking a logical product (AND) of the comparison signal xCO_D and the comparison signal CO.

The latch section 1033 has latch circuits L_0 to L_7 and an AND circuit AND2. The latch circuits L_0 to L_7 are the same as the circuits L_0 to L_7 shown in FIG. 13. The AND circuit AND2 outputs a control signal Hold_C obtained by taking a logical product (AND) of the comparison signal xCO_D from the inverting delay circuit DLY of the latch control section 1032 and a control signal Enable to the latch circuit L_7.

Next, an operation of the circuit according to the second conventional example will be described. FIG. 16 shows waveforms of the start pulse StartP, the phase signals CK[0] to CK[7], the phase signals CK[0] to CK[7], the comparison signal xCO_D, the comparison signal CO, the control signal Hold_L from the AND circuit AND1, the control signal Enable, the control signal Hold_C from the AND circuit AND2, and the output signals Q0 to Q7 of the latch circuits L_0 to L_7 of the latch section 1033. The horizontal direction of FIG. 16 represents time and the vertical direction of FIG. 16 represents voltage.

Hereinafter, different parts from the operation of the circuit according to the first conventional example will be described. After a first timing related to a comparison start in the comparison section 1031, the comparison signal CO from the comparison section 1031 is in the L state until voltages of the analog signal Signal and the reference signal Ramp input to the comparison section 1031 substantially coincide. While the comparison signal CO is in the L state, the comparison signal xCO_D from the inverting delay circuit DLY is in the H state. Because the comparison signal xCO_D from the inverting delay circuit DLY is in the H state and the comparison signal CO from the comparison section 1031 is in the L state, the control signal Hold_L from the AND circuit AND1 is in the L state. Thus, the latch circuits L_0 to L_6 are in the disable state.

On the other hand, because the control signal Enable is in the H state at the first timing related to the comparison start in the comparison section 1031 and the comparison signal xCO_D from the inverting delay circuit DLY is in the H state, the control signal Hold_C from the AND circuit AND2 is in the H state. Thus, the latch circuit L_7 is in the enable state.

Subsequently, the comparison signal CO from the comparison section 1031 is inverted at the second timing at which the voltages of the analog signal Signal and the reference signal Ramp substantially coincide. Because the comparison signal xCO_D from the inverting delay circuit DLY is in the H state and the comparison signal CO from the comparison section 1031 changes from the L state to the H state, the control signal Hold_L from the AND circuit AND1 changes from the L state to the H state. Thereby, the latch circuits L_0 to L_6 are in the enable state.

Further, the comparison signal xCO_D from the inverting delay circuit DLY changes from the H state to the L state at the third timing at which a predetermined time has elapsed from the timing at which the comparison signal CO from the comparison section 1031 has been inverted. Thereby, because the control signal Hold_L of the AND circuit AND1 and the control signal Hold_C of the AND circuit AND2 change from the H state to the L state, the latch circuits L_0 to L_7 are in the disable state.

In the above-described operation, it is possible to reduce current consumption as compared with the first conventional example because the latch circuits L_0 to L_6 operate only in the period from the second timing to the third timing.

As a specific configuration of the inverting delay circuit DLY, for example, the application of a so-called delay line in which inverter circuits are connected in multiple stages disclosed in ITE Technical Report Vol. 37, No. 29 is considered.

However, the degradation of AD conversion precision is caused by power supply noise and ground bounce in a conventional tdcSS type AD conversion circuit and a solid-state imaging apparatus using the same.

In a column circuit provided in the solid-state imaging apparatus using the conventional tdcSS type AD conversion circuit, a comparison section 1031, a latch control section 1032, a latch section 1033, and a count section 1034 are disposed for every column in correspondence with each column of an array of pixels disposed in a matrix. Although a power supply voltage VDD is supplied to each section of the column circuit, wiring resistance further increases when the column circuit is closer to a center column than an end column (that is, the column circuit is farther from the power supply) and therefore a larger voltage drop occurs and the power supply voltage VDD decreases. In addition, when current consumption in the circuit further increases, the voltage drop becomes larger. In addition, for a similar reason, the ground voltage GND is further raised when the column circuit is closer to the center column than the end column (that is, the column circuit is farther from the ground). For example, even when the power supply voltage VDD=1.5 [V] and the ground voltage GND=0 [V] in the example of the end column of the column circuit, the power supply voltage VDD=about 1.2 [V] and the ground voltage GND=about 0.3 [V] in the center column of the column circuit in some cases.

Comparison signals CO from the comparison sections 1031 of all columns are inverted substantially simultaneously during an AD conversion period (for example, an AD conversion period of a reset level substantially constant in all pixels) and therefore the inverting delay circuit DLY and the latch circuits L_0 to L_6 may start (may be in the enable state) substantially simultaneously. In this case, transient currents flow substantially simultaneously within the inverting delay circuits DLY and the latch circuits L_0 to L_6 of all the columns and therefore transient bounces of the power supply and the ground by these transient currents and wiring resistance (the transient voltage leakage around the power supply voltage VDD=1.2 [V] and the ground voltage GND=0.3 [V]) occur particularly in the vicinity of the center column of the column circuit.

In particular, because a through-current flowing through a transistor constituting an inverter circuit is large when a logic state of an input signal has been inverted in the inverter circuit, the bounces of the power supply and the ground tend to occur. In addition, a propagation delay time of the inverter circuit significantly depends upon a difference between the power supply voltage and the ground voltage.

In the conventional tdcSS type AD conversion circuit, the latch circuits L_0 to L_7 are in the disable state at the third timing at which a delay time has elapsed in the inverting delay circuit DLY from the second timing at which operations of the latch circuits L_0 to L_6 have started substantially simultaneously and the logic states of the phase signals CK[0] to CK[7] are latched. However, in the vicinity of the center column of the column circuit, the delay time of the inverting delay circuit DLY changes and the third timing, which is the latch timing, changes depending on the voltages (bounce magnitudes) of the power supply and the ground.

In particular, in the inverting delay circuit DLY based on a configuration in which a plurality of inverter circuits are connected, a delay time tDLY of each inverter circuit changes depending on a change in the voltages (bounce magnitudes) of the power supply and the ground and the delay time tDLY of each inverter circuit is accumulated. Thereby, there is a possibility of the delay time of the inverting delay circuit DLY greatly changing and it being difficult for the latch circuits L_0 to L_7 to accurately latch logic states of the phase signals CK[0] to CK[7]. This problem is likely to occur when comparison signals CO from a large number of comparison sections 1031 change substantially simultaneously. As a result, AD conversion precision is likely to be degraded.

SUMMARY OF THE INVENTION

According to a first aspect of the present invention, a solid-state imaging apparatus includes: an imaging section in which a plurality of pixels, each of which has a photoelectric conversion element, are disposed in a matrix; a clock generation section configured to generate a plurality of phase signals including different phases from each other; a reference signal generation section configured to generate a reference signal whose amplitude increases or decreases with the passage of time; a comparison section disposed corresponding to a column in an array of the plurality of pixels and configured to start a comparison process on a pixel signal output from the pixel and the reference signal at a first timing and end the comparison process at a second timing at which the reference signal has satisfied a predetermined condition with respect to the pixel signal; a latch section disposed corresponding to the comparison section and configured to latch logic states of the plurality of phase signals; and a latch control section disposed corresponding to the comparison section and configured to enable the latch section at the second timing and cause the latch section to execute a latch operation at a third timing at which a time based on a current output from the comparison section has elapsed from the second timing, wherein the comparison section includes a differential amplifier including a first transistor with a gate to which the reference signal is input and a second transistor with a gate to which the pixel signal is input and configured to output a first comparison signal determined according to a result of comparing the reference signal to the pixel signal when the comparison process is executed, a current output element configured to output substantially a constant current when the comparison process is executed, and a third transistor, wherein the third transistor includes a gate to which the first comparison signal is input, before the second timing at which a state of the first comparison signal changes, a current output from the current output element flows between a drain and a source, and after the second timing, the third transistor becomes an OFF state, and wherein the comparison section outputs a second comparison signal based on the current output from the current output element after the second timing.

According to a second aspect of the present invention, in the solid-state imaging apparatus according to the first aspect, the current output element may be a fourth transistor including a gate to which a reference voltage is input.

According to a third aspect of the present invention, in the solid-state imaging apparatus according to the first aspect, the current output element may output a current less than or equal to a sum of a current flowing between the drain and the source of the first transistor and a current flowing between the drain and the source of the second transistor.

According to a fourth aspect of the present invention, in the solid-state imaging apparatus according to the first aspect, a column in the array of the plurality of pixels may be classified as one of a plurality of first columns or one of a plurality of second columns, the current output element of the comparison section to which the pixel signal output from the pixel in the first column is input may output a first current, and the current output element of the comparison section to which the pixel signal output from the pixel in the second column is input may output a second current having a different current value than the first current.

According to a fifth aspect of the present invention, in the solid-state imaging apparatus according to the first aspect, a column in the array of the plurality of pixels may be classified as any one of a plurality of first columns or one of a plurality of second columns, a first load capacitor may be connected to a contact point between the current output element of the comparison section to which the pixel signal output from the pixel in the first column is input and the third transistor, and a second load capacitor having a different capacitance value than the first load capacitor may be connected to a contact point between the current output element of the comparison section to which the pixel signal output from the pixel in the second column is input and the third transistor.

According to a sixth aspect of the present invention, in the solid-state imaging apparatus according to the fourth or fifth aspect, one of the plurality of first columns may be disposed for every predetermined number of columns in the array of the plurality of pixels and the one of the plurality of second columns may be disposed for every predetermined number of columns in the array of the plurality of pixels.

According to a seventh aspect of the present invention, in the solid-state imaging apparatus according to the sixth aspect, each of the plurality of first columns and the plurality of second columns may be configured of a plurality of columns continuous in the array of the plurality of pixels.

According to an eighth aspect of the present invention, in the solid-state imaging apparatus according to the seventh aspect, the array of the plurality of pixels may be an array including a plurality of unit arrays, each of which is configured of a plurality of continuous columns.

According to a ninth aspect of the present invention, in the solid-state imaging apparatus according to the sixth aspect, two columns of the plurality of first columns may be not adjacent to each other, two columns of the plurality of second columns may be not adjacent to each other, and one column of the plurality of first columns may be adjacent to one column of the plurality of second columns.

According to a tenth aspect of the present invention, in the solid-state imaging apparatus according to the sixth aspect, the first and second columns may be disposed in a region corresponding to one half or less of a cycle of a change in the pixel signal of the row direction in the array of the plurality of pixels.

According to an eleventh aspect of the present invention, an imaging device includes the solid-state imaging apparatus according to the first aspect.

DETAILED DESCRIPTION OF THE INVENTION

Hereinafter, embodiments of the present invention will be described with reference to the drawings.

First Embodiment

Figure 1:
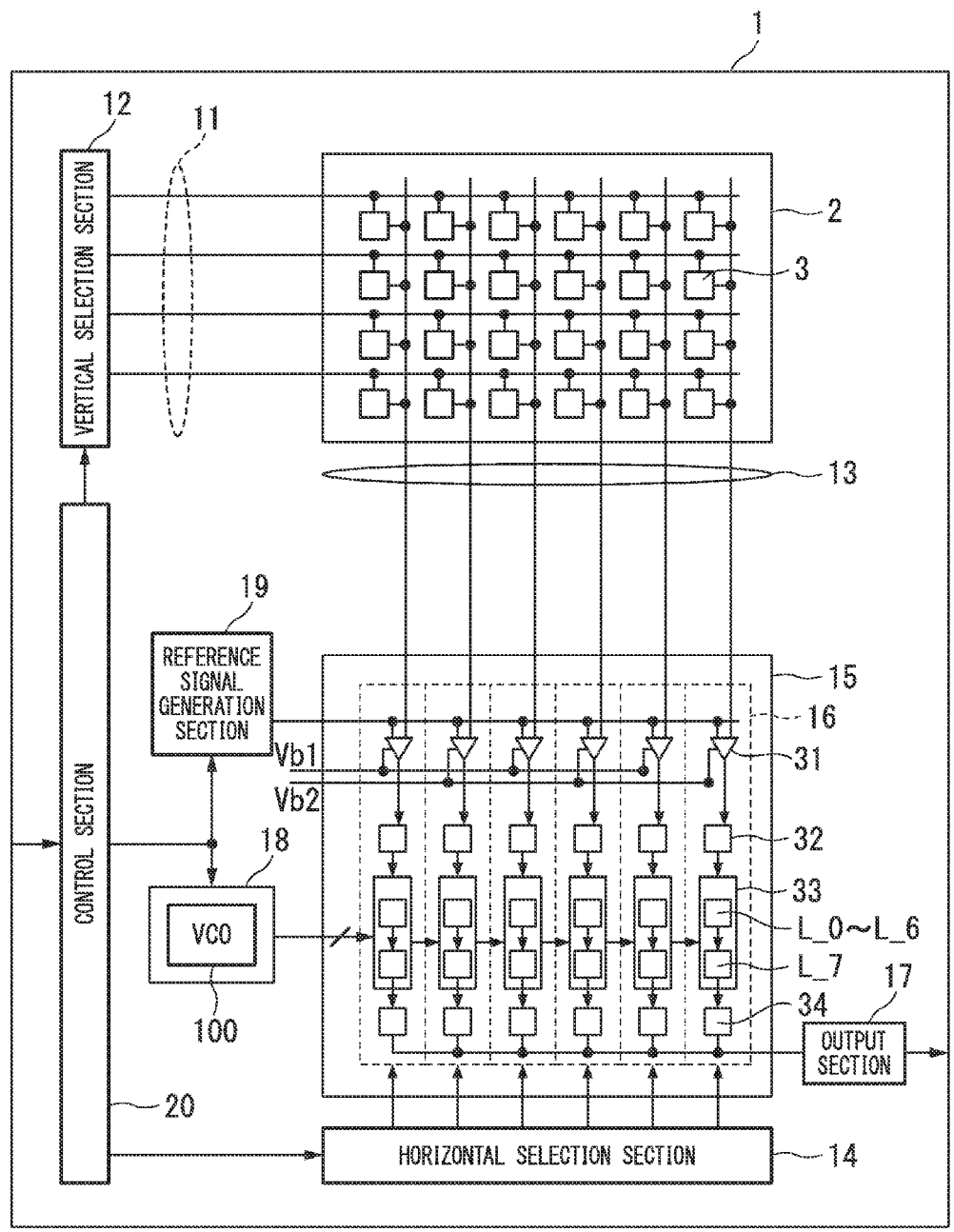
FIG. 1 is a block diagram showing a configuration of a solid-state imaging apparatus according to a first embodiment of the present invention.

First, the first embodiment of the present invention will be described. FIG. 1 shows an example of a configuration of a solid-state imaging apparatus according to this embodiment. The solid-state imaging apparatus 1 shown in FIG. 1 has an imaging section 2, a vertical selection section 12, a horizontal selection section 14, a column processing section 15, an output section 17, a clock generation section 18, a reference signal generation section 19, and a control section 20.

The imaging section 2 includes a plurality of unit pixels 3, each of which has a photoelectric conversion element, disposed in a matrix. Each of the unit pixels 3 generates a pixel signal corresponding to a magnitude of incident electromagnetic waves and outputs the pixel signal to the vertical signal line 13 provided for every column. The vertical selection section 12 selects each row of the imaging section 2. The clock generation section 18 generates a plurality of phase signals having different phases from each other. The reference signal generation section 19 generates a reference signal (ramp wave) which increases or decreases with the passage of time. The column processing section 15 has a column AD conversion section 16 which AD-converts the pixel signal from the unit pixel 3. The horizontal selection section 14 reads the AD-converted digital data to the horizontal signal line. The output section 17 outputs the digital data read through the horizontal selection section 14 to a subsequent stage circuit. The control section 20 controls each unit.

Although the case of the imaging section 2 including unit pixels 3 in 4 rows×6 columns for simplicity in FIG. 1 will be described, the number of rows and the number of columns of the array of the unit pixels 3 need only be arbitrary natural numbers greater than or equal to 2. In reality, tens to hundreds of thousands of unit pixels 3 are disposed in each row or each column of the imaging section 2. Although not shown, the unit pixel 3 constituting the imaging section 2 includes a photoelectric conversion element, such as a photodiode, a photo gate, a photo transistor or the like, and a transistor circuit.

Hereinafter, each section will be described in further detail. The imaging section 2 includes the unit pixels 3 two-dimensionally disposed in only 4 rows×6 columns. In addition, each row control line 11 is wired for every row in the pixel array of 4 rows×6 columns. Each end of the row control line 11 is connected to an output terminal of a corresponding row of the vertical selection section 12. The vertical selection section 12 includes a shift register, a decoder, or the like, and controls row addressing and row scanning of the imaging section 2 through the row control line 11 when each unit pixel 3 of the imaging section 2 is driven. In addition, a vertical signal line 13 is wired to each column in the pixel array of the imaging section 2.

The column processing section 15, for example, includes column AD conversion sections 16 provided for every column of the pixel array of the imaging section 2, that is, for every vertical signal line 13. Each of the column AD conversion sections 16 converts an analog pixel signal read via the vertical signal line 13 for every column from each unit pixel 3 of the imaging section 2 into digital data. Although the column AD conversion sections 16 are disposed in one-to-one correspondence with the columns of the pixel array of the imaging section 2 in this example, this is only an example and the present invention is not limited to this layout relationship. For example, it is also possible to adopt a configuration in which one column AD conversion section 16 is disposed for a plurality of columns of the pixel array of the imaging section 2 and the one column AD conversion section 16 is used in time division among the plurality of columns. The column processing section 15 constitutes an AD conversion means (AD conversion circuit) which converts an analog pixel signal read from the unit pixel 3 of a selection row of the imaging section 2 into digital pixel data along with the reference signal generation section 19 as will be described below.

The clock generation section 18 includes a voltage controlled oscillator (VCO) 100 which is a ring delay circuit in which a plurality of delay units (inverting elements) are connected in a ring shape and a symmetric oscillation circuit. A phase signal having a constant phase difference is output from each delay unit. An asymmetric oscillation circuit or the like in which the number of phase signals to be output is a power of 2 may be used in the clock generation section 18. Although a ring delay circuit is preferable as the clock generation section 18, the present invention need not be limited thereto.

The reference signal generation section 19, for example, includes an integration circuit. Following the control of the control section 20, the reference signal generation section 19 generates a so-called ramp wave which is a reference signal of which a level varies with time in an inclined pattern, and supplies the reference signal to the column AD conversion section 16 of the column processing section 15 via the reference signal line. The reference signal generation section 19 is not limited to a configuration using an integration circuit as the reference signal generation section 19, but a digital-to-analog converter (DAC) circuit may be used as the reference signal generation section 19. However, when a configuration in which the ramp wave is digitally generated using the DAC circuit is adopted, it is necessary to decrease a step of the ramp wave or adopt a configuration equivalent thereto.

The horizontal selection section 14 includes a shift register, a decoder, or the like, and controls the column addressing and the column scanning of the column AD conversion section 16 of the column processing section 15. Following the control of the horizontal selection section 14, the digital data obtained by AD conversion of the column AD conversion section 16 is read to the output section 17 via the horizontal signal line in order.

The control section 20 includes a functional block of a timing generator (TG) which supplies clocks or predetermined timing pulse signals necessary for operations of the sections such as the vertical selection section 12, the clock generation section 18, the reference signal generation section 19, the horizontal selection section 14, the column processing section 15, and the output section 17, and a functional block for communicating with the TG.

The output section 17 outputs binary digital data. In addition, the output section 17, for example, may incorporate a signal processing function such as black level adjustment, column variation correction, and color processing in addition to a buffering function. Further, the output section 17 may convert n-bit parallel digital data into serial data to output the serial data.

Next, a configuration of the column AD conversion section 16 will be described. The column AD conversion section 16 compares the analog pixel signal read via the vertical signal line 13 from each unit pixel 3 of the imaging section 2 with the reference signal for AD conversion applied from the reference signal generation section 19 to generate a pulse signal having a magnitude (pulse width) in a time axis direction corresponding to the magnitude of the pixel signal. Then, the column AD conversion section 16 performs the AD conversion by converting the data corresponding to a period of the pulse width of the pulse signal into the digital data corresponding to the magnitude of the pixel signal.

Hereinafter, the configuration of the column AD conversion section 16 will be described in detail. The column AD conversion section 16 is disposed for every column of the pixel array of the imaging section 2. In FIG. 1, six column AD conversion sections 16 are disposed. The column AD conversion sections 16 of the columns have the same configuration. The column AD conversion section 16 includes a comparison section 31, a latch control section 32, a latch section 33, and a count section 34.

The comparison section 31 is disposed corresponding to a column of the pixel array of the imaging section 2. Because the column AD conversion section 16 may be disposed for a plurality of columns of the pixel array of the imaging section 2 as described above, the comparison section 31 may be disposed for the plurality of columns of the pixel array of the imaging section 2. That is, the comparison section 31 is disposed for every one or more columns of the pixel array of the imaging section 2.

The comparison section 31 compares a signal voltage corresponding to the analog pixel signal output via the vertical signal line 13 from the unit pixel 3 of the imaging section 2 with a ramp voltage of the reference signal supplied from the reference signal generation section 19 to convert the magnitude of the pixel signal into information (the pulse width of the pulse signal) of the time axis direction. A comparison signal output by the comparison section 31, for example, has a High level (H level) when the ramp voltage is greater than the signal voltage and has a Low level (L level) when the ramp voltage is less than or equal to the signal voltage.

The comparison section 31 starts a comparison process on the pixel signal output from the unit pixel 3 and the reference signal at a first timing and ends the comparison process at a second timing at which the reference signal has satisfied a predetermined condition with respect to the pixel signal (the timing at which voltages of the reference signal and the pixel signal substantially coincide in this example). At the timing at which the comparison section 31 ends the comparison process, a comparison signal from the comparison section 31 is inverted.

The latch section 33, the latch control section 32, and the count section 34 are disposed corresponding to the configuration of the comparison section 31. The latch section 33 has a plurality of latch circuits L_0 to L_7 which latch (retains/store) logic states of a plurality of phase signals output from the clock generation section 18. Encoding is performed in the output section 17 based on the logic states of the plurality of phase signals latched by the latch section 33 and lower-order bit data (lower-order data) constituting digital data is obtained.

The latch control section 32 generates a control signal for controlling the operation of the latch section 33. The latch control section 32 enables the latch section 33 at the second timing and causes the latch section 33 to perform a latch operation at the third timing at which a time based on a current (comparison signal current) output from the comparison section 31 has elapsed from the second timing.

The count section 34 performs a count operation based on a phase signal (a phase signal CK[7] in this example) output from the clock generation section 18. The count section 34 performs the count operation and therefore higher-order bit data (higher-order data) constituting digital data is obtained.

Here, signals corresponding to logic states of a plurality of phase signals CK[0] to CK[7] latched by the latch section 33 are, for example, 8-bit data. In addition, a higher-order data signal constituted of a count value of the count section 34 is, for example, 10-bit data. Ten bits are an example and fewer than 10 bits (for example, 8 bits), more than 10 bits (for example, 12 bits), or the like may be provided.

In this embodiment, a column of an array of the plurality of unit pixels 3 is classified as any one of a plurality of columns (a plurality of column groups) including a first column (first column group) and a second column (second column group). The first column, the second column, or the like is the name for identifying the column in the array of the plurality of unit pixels 3. In the solid-state imaging apparatus 1, an odd-numbered column is the first column and an even-numbered column is the second column. Three or more types of columns may be present. Different reference voltages are supplied to the comparison sections 31 of the plurality of columns including the first and second columns. In the solid-state imaging apparatus 1, a first reference voltage Vb1 is supplied to the comparison section 31 of the first column. In addition, a second reference voltage Vb2 different from the first reference voltage Vb1 is supplied to the comparison section 31 of the second column. For example, the first reference voltage Vb1 is greater than the second reference voltage Vb2.

In this embodiment, one of the plurality of first columns is disposed for every predetermined number of columns in the array of the plurality of unit pixels 3 and one of the plurality of second columns is disposed for every predetermined number of columns in the array of the plurality of unit pixels 3. In the solid-state imaging apparatus 1, one of the plurality of the first columns is disposed for every two columns in the array of the plurality of unit pixels 3 and one of the plurality of the second columns is disposed for every two columns in the array of the plurality of unit pixels 3. Every two columns of the plurality of the first columns are not adjacent to each other. Every two columns of the plurality of the second columns are not adjacent to each other. In addition, one column of the plurality of the first columns is adjacent to one column of the plurality of the second columns. In the solid-state imaging apparatus 1, one column of the plurality of the first columns and one column of the plurality of the second columns are alternately arranged. The plurality of the first columns and the plurality of the second columns may be arranged such that two or more columns of the plurality of the first columns and the plurality of the second columns are continuous in the array of the plurality of unit pixels 3.

Next, an operation of this example will be described. Here, although the description of a specific operation of the unit pixel 3 will be omitted, a reset level and a signal level are output from the unit pixel 3 as is well known.

The AD conversion is performed as follows. For example, digital data corresponding to a magnitude of a pixel signal is obtained by measuring a length of a period from a point in time (first timing) at which comparison process of comparing voltages of the reference signal which decreases at a predetermined gradient and the pixel signal has started to a point in time (third timing) at which a predetermined time has further elapsed after the voltage (ramp voltage) of the reference signal and the voltage of the pixel signal coincide to each other (second timing). The above-mentioned measure process is performed based on the count value of the count section 34 and encode values of the logic states of the plurality of phase signals CK[0] to CK[7] latched by the latch section 33.

In this embodiment, the above-described AD conversion is performed for each of the reset level and the signal level read from the unit pixel 3. More specifically, the reset level including noise of the pixel signal is read from each unit pixel 3 of a selected row of the imaging section 2 in a first read operation and AD-converted. Then, the signal level corresponding to an electromagnetic wave incident on the unit pixel 3 is read in a second read operation and AD-converted. Thereafter, digital data corresponding to a signal component is obtained by digitally performing subtraction (a correlated double sampling (CDS) process) on the reset level and the signal level. The signal level may be read in the first read operation and AD-converted and then the reset level may be read in the second read operation and AD-converted. In addition, the present invention need not be limited thereto.

(First Read)

After a pixel signal (reset level) output from the unit pixel 3 of an arbitrary row of the pixel array of the imaging section 2 to the vertical signal line 13 is stabilized, the control section 20 supplies the reference signal generation section 19 with control data used for generating a reference signal. In response thereto, the reference signal generation section 19 outputs the reference signal, which has a waveform temporally varying in a ramp shape as a whole, as a comparison voltage to be applied to a first input terminal of the comparison section 31. The comparison section 31 compares the reference signal with the pixel signal. The latch control section 32 sets the latch circuit L_7 of the latch section 33 in an enable (valid or active) state at the timing (first timing) at which the comparison by the comparison section 31 has started. In addition, the count section 34 performs a count operation using the phase signal CK[7] from the clock generation section 18 as a count clock.

The comparison section 31 compares the reference signal applied from the reference signal generation section 19 with the pixel signal and inverts a comparison signal when the two voltages coincide (second timing). When the comparison signal from the comparison section 31 has been inverted, the latch control section 32 sets the latch circuits L_0 to L_6 of the latch section 33 to the enable state.

After the comparison signal from the comparison section 31 is inverted, the latch circuits L_0 to L_7 of the latch section 33 are in the disable (invalid or hold) state to latch the logic states of the plurality of phase signals CK[0] to CK[7] from the clock generation section 18 when the control signal from the latch control section 32 has been inverted by the inversion (third timing). Simultaneously, the count section 34 latches a count value. Thereby, digital data corresponding to the reset level is obtained. The control section 20 stops the supply of control data to the reference signal generation section 19 and the output of the phase signal from the clock generation section 18 when a predetermined time has elapsed. Thereby, the reference signal generation section 19 stops the generation of the reference signal.

(Second Read)

After a pixel signal (signal level) output from the unit pixel 3 of an arbitrary row of the pixel array of the imaging section 2 to the vertical signal line 13 is stabilized, the control section 20 supplies the reference signal generation section 19 with control data for generating a reference signal. In response thereto, the reference signal generation section 19 outputs the reference signal, which has a waveform temporally varying in a ramp shape as a whole, as a comparison voltage to be applied to a first input terminal of the comparison section 31. The comparison section 31 compares the reference signal with the pixel signal. The latch control section 32 sets the latch circuit L_7 of the latch section 33 to an enable state at the timing (first timing) at which the comparison by the comparison section 31 has started. In addition, the count section 34 performs a count operation using the phase signal CK[7] from the clock generation section 18 as a count clock.

The comparison section 31 compares the reference signal applied from the reference signal generation section 19 with the pixel signal and inverts a comparison signal when the two voltages coincide (second timing). When the comparison signal from the comparison section 31 has been inverted, the latch control section 32 sets the latch circuits L_0 to L_6 of the latch section 33 to the enable state.

After the comparison signal from the comparison section 31 is inverted, the latch circuits L_0 to L_7 of the latch section 33 are in the disable state to latch the logic states of the plurality of phase signals CK[0] to CK[7] from the clock generation section 18 when the control signal from the latch control section 32 has been inverted by the inversion (third timing). Simultaneously, the count section 34 latches a count value. Thereby, digital data corresponding to the signal level is obtained. The control section 20 stops the supply of control data to the reference signal generation section 19 and the output of the phase signal from the clock generation section 18 when a predetermined time has elapsed. Thereby, the reference signal generation section 19 stops the generation of the reference signal.

The digital data corresponding to the reset level and the digital data corresponding to the signal level are transferred to the output section 17 via the horizontal signal line by the horizontal selection section 14. The output section 17 performs the encode process and subtraction (CDS process) based on the digital data and therefore digital data of a signal component is obtained. The output section 17 may be embedded in the column processing section 15.

Figure 2:
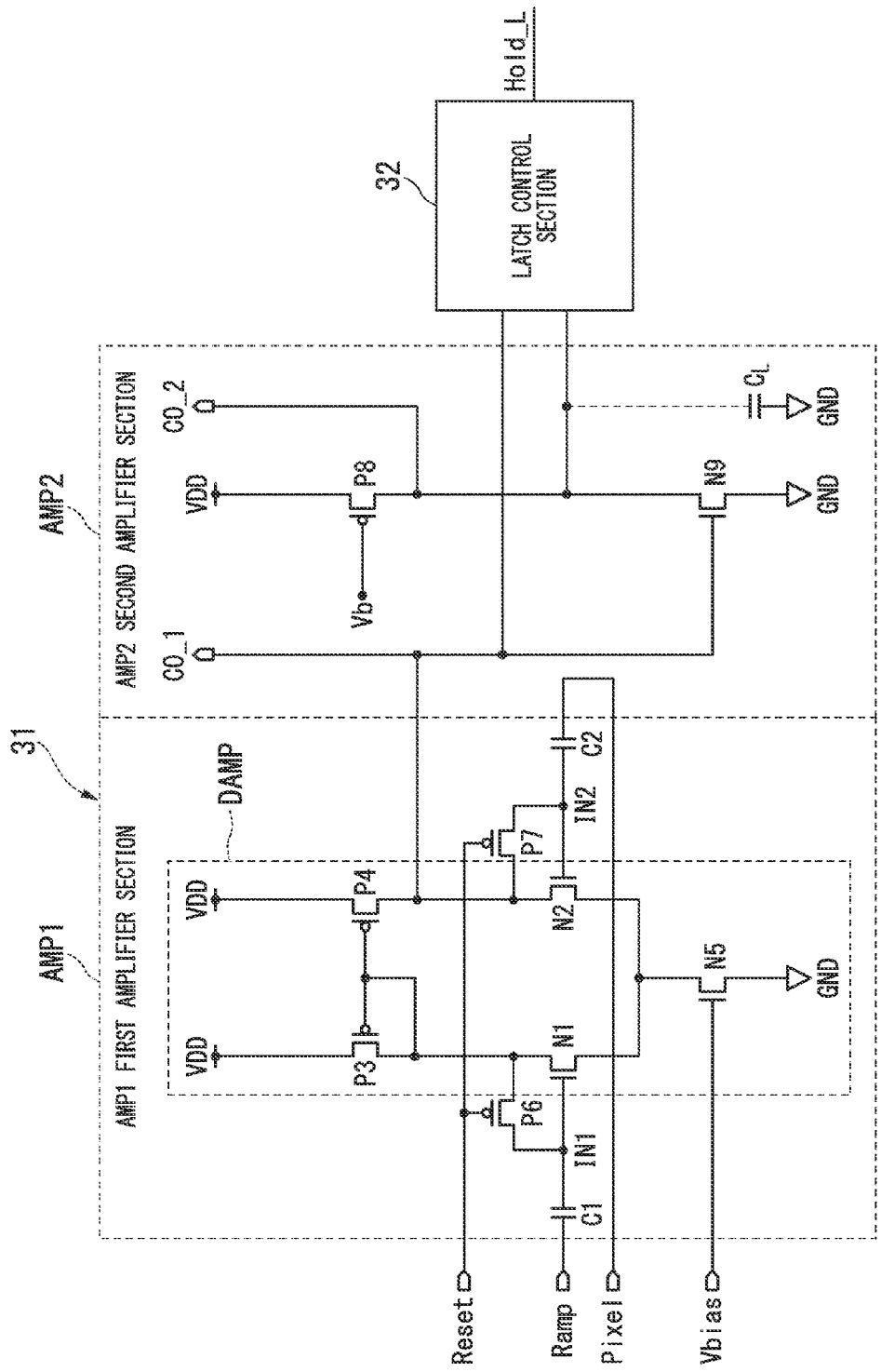
FIG. 2 is a circuit diagram showing a configuration of a comparison section provided in the solid-state imaging apparatus according to the first embodiment of the present invention.

Next, a detailed configuration of the comparison section 31 will be described. FIG. 2 shows an example of the configuration of the comparison section 31. The comparison section 31 has a first amplifier section AMP1 and a second amplifier section AMP2. Hereinafter, a configuration of the comparison section 31 will be described using the power supply voltage VDD and the ground GND as an example of a power supply source.

The first amplifier section AMP1 has a differential amplifier DAMP, transistors P6 and P7, and capacitive elements C1 and C2. The differential amplifier DAMP has N type transistors N1 and N2 constituted of N type metal oxide semiconductors (NMOSs) having a commonly connected source, P type transistors P3 and P4 connected between drains of the transistors N1 and N2 and the power supply VDD and constituted of P type metal oxide semiconductors (PMOSs) having a commonly connected gate, and a current source N5 constituted of the NMOS connected between a node commonly connected to sources of the transistors N1 and N2 and the ground GND. In addition, the differential amplifier DAMP has a first input terminal IN1 (a gate of the transistor N1) electrically connected to the reference signal generation section 19 and a second input terminal IN2 (a gate of the transistor N2) electrically connected to the unit pixel 3, and compares the voltages of the first input terminal IN1 and the second input terminal IN2.

A P type transistor P6 constituted of the PMOS is connected between the gate and the drain of the transistor N1. A P type transistor P7 constituted of the PMOS is connected between the gate and the drain of the transistor N2. A low active reset pulse Reset is applied to the gates of these transistors P6 and P7 and therefore the transistors p6 and P7 are in the ON state and the gate and the drain of each of the transistors N1 and N2 are short-circuited. Thereby, the transistors P6 and P7 function as a reset section for resetting (initializing) voltages of the gates of the transistors N1 and N2, that is, voltages of two input terminals of the differential amplifier DAMP. An operation point of the differential amplifier DAMP when the comparison process starts is determined by resetting the voltages of the two input terminals of the differential amplifier DAMP.

First terminals of the capacitive elements C1 and C2 for cutting a DC level and sampling a predetermined voltage at a reset time are connected to the gates of the transistors N1 and N2, that is, a first input terminal IN1 and a second input terminal IN2 of the differential amplifier DAMP. A second terminal of the capacitive element C1 is electrically connected to the reference signal generation section 19 and receives a reference signal Ramp applied from the reference signal generation section 19. A second terminal of the capacitive element C2 is electrically connected to the unit pixel 3 of the imaging section 2 and a pixel signal Pixel output from each unit pixel 3 is applied to the second terminal of the capacitive element C2. In addition, a bias voltage Vbias used for controlling a current value is applied to the gate of the current source N5.

The drain of the transistor N1 is connected to the drain and the gate of the transistor P3. The source of the transistor P3 is connected to the power supply VDD. The drain of the transistor N2 is connected to the drain of the transistor P4 and the source of the transistor P4 is connected to the power supply VDD. The drain of the transistor N2 is also connected to the second amplifier section AMP2.

In the first amplifier section AMP1 configured as described above, the differential amplifier DAMP has the transistor N1 (first transistor) having the gate to which the reference signal Ramp is input and the transistor N2 (second transistor) having the gate to which the pixel signal Pixel is input, and outputs a first comparison signal CO_1 corresponding to a result of comparing the reference signal Ramp with the pixel signal Pixel from the drain of the transistor N2 when the comparison process is executed.

The second amplifier section AMP2 has an N type transistor N9 (third transistor) constituted of the NMOS having the same conductivity type as the transistors N1 and N2 constituting the differential amplifier DAMP and a P type transistor P8 (current output element) constituted of the PMOS having a different conductivity type from the transistors N1 and N2. The gate of the transistor N9 is connected to the drain of the transistor N2 and the drain of the transistor P4, the drain of the transistor N9 is connected to the drain of the transistor P8, and the source of the transistor N9 is connected to the ground GND.

The gate of the transistor P8 is connected to a voltage source for outputting a constant reference voltage Vb. The reference voltage Vb is either of the first reference voltage Vb1 and the second reference voltage Vb2. The first reference voltage Vb1 is input to the gate of the transistor P8 of the comparison section 31 of the first column in the array of the plurality of unit pixels 3. In addition, the second reference voltage Vb2 is input to the gate of the transistor P8 of the comparison section 31 of the second column in the array of the plurality of unit pixels 3. For example, the reference voltage Vb is a voltage higher than the L level and is a voltage lower than the power supply voltage by a threshold value of the transistor P8. The source of the transistor P8 is connected to the power supply VDD. In addition, in FIG. 2, an output load CL including input capacitance and parasitic capacitance of the latch control section 32 of the subsequent stage of the comparison section 31 and the like is shown.

In the second amplifier section AMP2 configured as described above, the transistor P8 outputs a current based on the reference voltage Vb input to the gate from the drain when the comparison process is executed. The reference voltage Vb is a constant voltage. Thus, the transistor P8 becomes a current output element (fourth transistor) for outputting a substantially constant current when the comparison process is executed. It is desirable for the transistor P8 to output a current less than or equal to a sum of a current flowing between the drain and the source of the transistor N1 and a current flowing between the drain and the source of the transistor N2.

The first comparison signal CO_1 is input to the gate of the transistor N9. The transistor N9 is turned on before the second timing at which the state of the first comparison signal CO_1 changes. The current output from the transistor P8 flows between the drain and the source of the transistor N9. After the second timing, the transistor N9 is in the OFF state. Thereby, the comparison section 31 (second amplifier section AMP2) outputs a second comparison signal CO_2 based on the current output from the transistor P8 from a contact point between the transistor P8 and the transistor N9 (the drain of the transistor P8 and the drain of the transistor N9) after the second timing. A detailed operation of the second amplifier section AMP2 will be described below.

The latch control section 32 is connected to the comparison section 31. The latch control section 32 has a first input terminal and a second input terminal. The first input terminal of the latch control section 32 is connected to the drain of the transistor N2 and the drain of the transistor P4. The second input terminal of the latch control section 32 is connected to the drain of the transistor N9 and the drain of the transistor P8. The first comparison signal CO_1 is input to the first input terminal of the latch control section 32. The second comparison signal CO_2 is input to the second input terminal of the latch control section 32. The latch control section 32 outputs a control signal Hold_L based on the first comparison signal CO_1 and the second comparison signal CO_2.

Figure 3A:
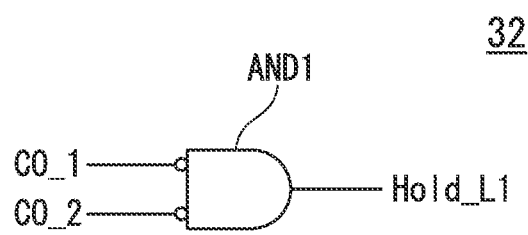
FIG. 3A is a circuit diagram showing a first configuration of a latch control section provided in the solid-state imaging apparatus according to the first embodiment of the present invention.
Figure 3B:
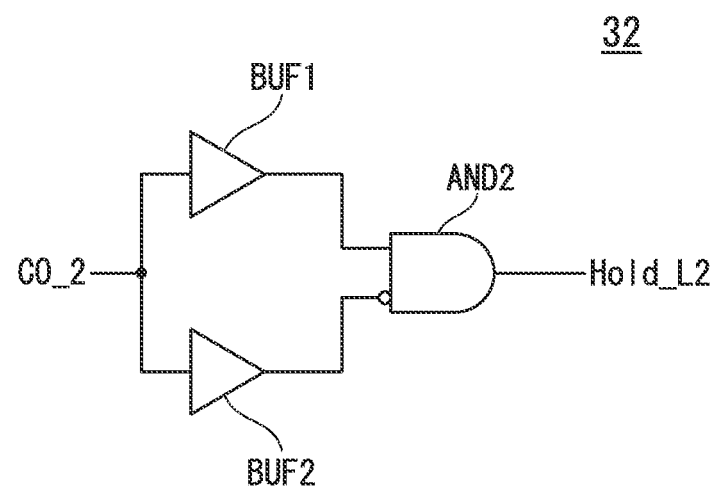
FIG. 3B is a circuit diagram showing a second configuration of the latch control section provided in the solid-state imaging apparatus according to the first embodiment of the present invention.

FIGS. 3A and 3B show configuration examples of the latch control section 32. FIG. 3A shows a first configuration example of the latch control section 32. FIG. 3B shows a second configuration example of the latch control section 32.

As shown in FIG. 3A, the latch control section 32 has an AND circuit AND1. A signal obtained by inverting the first comparison signal CO_1 is input to a first input terminal of the AND circuit AND1. In addition, a signal obtained by inverting the second comparison signal CO_2 is input to a second input terminal of the AND circuit AND1. The AND circuit AND1 performs a logical product (AND) operation on the signal input to the first input terminal and the signal input to the second input terminal and outputs a control signal Hold_L1 as an operation result.

As shown in FIG. 3B, the latch control section 32 has a buffer BUF1, a buffer BUF2, and an AND circuit AND2. The second comparison signal CO_2 is input to the buffer BUF1 and the buffer BUF2. The buffer BUF1 and the buffer BUF2 delay the input second comparison signal CO_2. A circuit threshold value of the buffer BUF1 is different from a circuit threshold value of the buffer BUF2. For example, the circuit threshold value of the buffer BUF1 is less than the circuit threshold value of the buffer BUF2.

A signal output from the buffer BUF1 is input to a first input terminal of the AND circuit AND2. In addition, the signal output from the buffer BUF2 is inverted and input to a second input terminal of the AND circuit AND2. The AND circuit AND2 performs a logical product (AND) operation on the signal input to the first input terminal and the signal input to the second input terminal and outputs an operation result as a control signal Hold_L2.

Next, the operation of the comparison section 31 will be described. In each of the first read operation of reading the pixel signal of the reset level and the second read operation of reading the pixel signal of the signal level, the comparison section 31 performs the following operation.

(Operation During Initialization)

After the pixel signal Pixel from the unit pixel 3 is applied to the second input terminal IN2 of the differential amplifier DAMP and the reference signal Ramp applied from the reference signal generation section 19 to the first input terminal IN1 of the differential amplifier DAMP is stabilized, the control section 20 activates the reset pulse Reset (Low active) before the comparison section 31 starts the comparison process. Thereby, the transistors P6 and P7 are in the ON state, the gate and the drain of each of the transistors N1 and N2 are short-circuited, and the voltages of the two input terminals are reset using the operation points of these transistors N1 and N2 as the drain voltage.

At the operation point determined by this reset operation (initialization), an offset component between the voltages of the two input terminals of the differential amplifier DAMP, that is, gate voltages of the transistors N1 and N2, is substantially cancelled. That is, the voltages of the two input terminals of the differential amplifier DAMP are reset to be substantially the same. After the above-described initialization ends, the transistors P6 and P7 are in the OFF state and the gate and the drain of each of the transistors N1 and N2 are separated.

(Operation when Voltage of Reference Signal Ramp Voltage of Pixel Signal Pixel)

Figure 4:
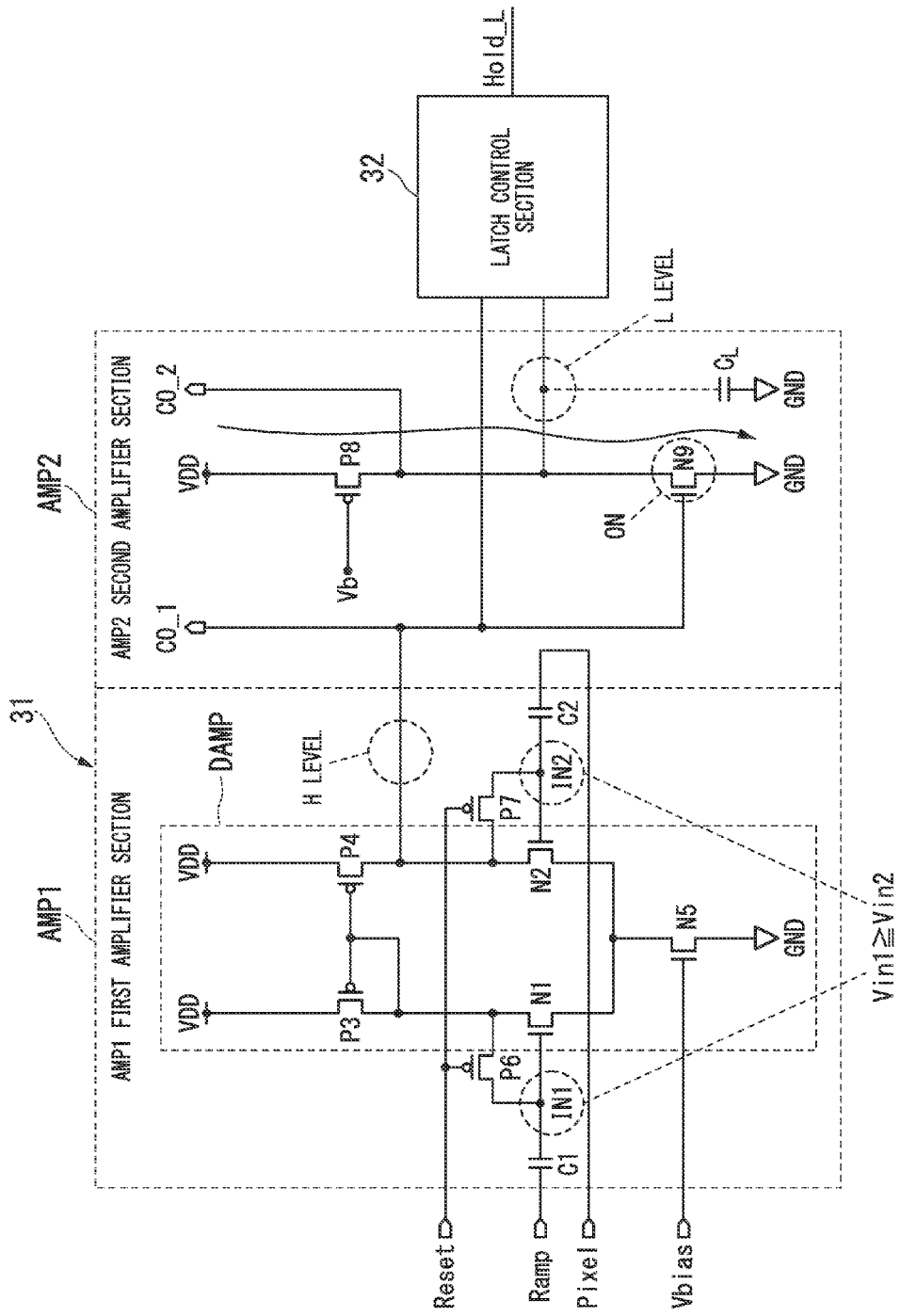
FIG. 4 is a circuit diagram showing an operation of a comparison section provided in the solid-state imaging apparatus according to the first embodiment of the present invention.

After a voltage Vin1 of the first input terminal N1 of the differential amplifier DAMP is increased by applying the reference signal Ramp to the first input terminal IN1 of the differential amplifier DAMP, the comparison process starts and the voltage of the reference signal Ramp decreases in the ramp shape. FIG. 4 shows the state of the comparison section 31 until the voltage of the reference signal Ramp decreases and the voltage of the reference signal Ramp is substantially the same as the voltage of the pixel signal Pixel after the initialization ends and the voltage of the reference signal Ramp is higher than the voltage of the pixel signal Pixel.

When the voltage of the reference signal Ramp is higher than the voltage of the pixel signal Pixel, the voltage Vin1 of the first input terminal N1 of the differential amplifier DAMP is higher than the voltage Vin2 of the second input terminal IN2 of the differential amplifier DAMP. In this case, the transistor N2 is in the OFF state and the voltage of the drain of the transistor N2 becomes an H level. That is, when the comparison process is executed, the transistor N2 outputs the first comparison signal CO_1 of the H level based on a result of comparing the reference signal Ramp with the pixel signal Pixel from the drain.

The first comparison signal CO_1 output from the drain of the transistor N2 is input to the gate of the transistor N9. Thus, the voltage of the gate of the transistor N9 becomes the H level. Thereby, the transistor N9 is in the ON state and a current flows between the drain and the source of the transistor N9.

The transistor P8 is in the ON state due to the reference voltage Vb input to the gate and a current based on the reference voltage Vb is output from the drain. This current flows between the drain and the source of the transistor N9.

At this time, in the second amplifier section AMP2, a current flows through a path passing through the transistors P8 and N9 from the power supply VDD to the ground GND. This current is limited by the reference voltage Vb applied to the gate of the transistor P8 and is sufficiently less than a through-current flowing through an inverter circuit. More specifically, this current is less than or equal to a sum of the current between the drain and the source of the transistor N1 and the current between the drain and the source of the transistor N2. In addition, because the voltage of the gate of the transistor N9 becomes the H level, the ON resistance of the transistor N9 is low and the voltage of the drain of the transistor P8, that is, the voltage of the second comparison signal CO_2, becomes the L level.

(Operation when Voltage of Reference Signal Ramp Voltage of Pixel Signal Pixel)

Figure 5:
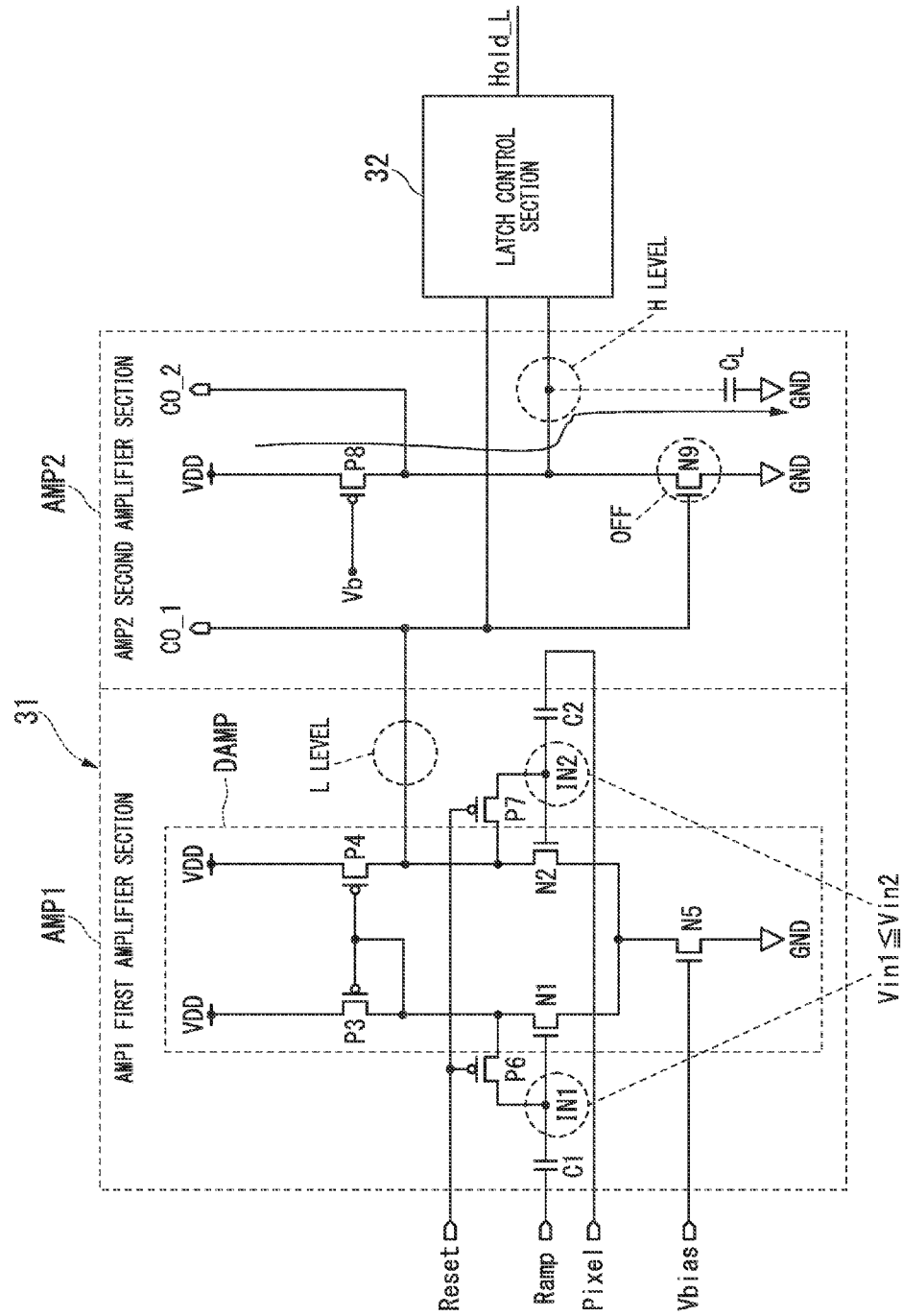
FIG. 5 is a circuit diagram showing an operation of the comparison section provided in the solid-state imaging apparatus according to the first embodiment of the present invention.

The voltage of the reference signal Ramp further decreases and the voltage of the reference signal Ramp becomes substantially the same as the voltage of the pixel signal Pixel (second timing). Thereafter, the voltage of the reference signal Ramp becomes lower than the voltage of the pixel signal Pixel. FIG. 5 shows a state of the comparison section 31 after the voltage of the reference signal Ramp decreases and the voltage of the reference signal Ramp becomes substantially the same as the voltage of the pixel signal Pixel.

When the voltage of the reference signal Ramp is less than the voltage of the pixel signal Pixel, the voltage Vin1 of the first input terminal N1 of the differential amplifier DAMP is lower than the voltage Vin2 of the second input terminal IN2 of the differential amplifier DAMP. In this case, because the transistor N1 is in the OFF state, no current flows between the drain and the source of the transistor N1, and the transistor N2 is in the ON state, the voltage of the drain of the transistor N2 becomes the L level. That is, when the comparison process is executed, the transistor N2 outputs the first comparison signal CO_1 of the L level from the drain, according to a result of comparing the reference signal Ramp with the pixel signal Pixel.

The first comparison signal CO_1 output from the drain of the transistor N2 is input to the gate of the transistor N9. Thus, the voltage of the gate of the transistor N9 becomes the L level. Thereby, the transistor N9 is in the OFF state.

The transistor P8 is in the ON state due to the reference voltage Vb input to the gate and a current based on the reference voltage Vb is output from the drain. The current output by the transistor P8 is substantially the same as the current output by the transistor P8 in the state of FIG. 4.

At this time, in the second amplifier section AMP2, a current flows through a path passing through the transistor P8 and the output load CL from the power supply VDD to the ground GND. This current is substantially the same as the current flowing through the second amplifier section AMP2 when the voltage of the reference signal Ramp is greater than the voltage of the pixel signal Pixel. In addition, this current is limited by the reference voltage Vb applied to the gate of the transistor P8 and is sufficiently less than a through-current flowing through an inverter circuit. More specifically, this current is less than or equal to a sum of the current flowing between the drain and the source of the transistor N1 and the current flowing between the drain and the source of the transistor N2. In addition, because the transistor N9 is in the OFF state, the voltage of the drain of the transistor P8, that is, the voltage of the second comparison signal CO_2, becomes the H level.

The latch control section 32 sets the latch circuits L_0 to L_6 of the latch section 33 in the enable state at the second timing based on the first comparison signal CO_1 and the second comparison signal CO_2. That is, the latch control section 32 sets the latch circuits L_0 to L_6 of the latch section 33 in the enable state at the second timing at which the voltage of the first comparison signal CO_1 changes from the H level to the L level or the second timing at which a predetermined time has elapsed from the timing at which the voltage of the first comparison signal CO_1 has changed from the H level to the L level. In addition, the latch control section 32 sets the latch circuits L_0 to L_7 of the latch section 33 in the disable state at the third timing based on the second comparison signal CO_2.

The voltage of the output load CL becomes the L level immediately before the second timing. Because the output load CL is charged with the current output by the transistor P8 after the second timing, the voltage of the output load CL, that is, the voltage V0 of the second comparison signal CO_2, satisfies Formula (1).

[Math 1]

$$V_0 = \frac{I_{const}}{C_L} \times t \qquad (1)$$

In Formula (1), $I_{const}$ denotes a current value (constant value) output from the transistor P8, $C_L$ denotes the capacitance value of the output load CL, and t denotes time. As shown in Formula (1), the voltage V0 of the second comparison signal CO_2 linearly increases with a gradient based on the constant current value Iconst. At the timing (third timing) at which the voltage V0 has exceeded the circuit threshold value of the latch control section 32, the latch control section 32 causes the latch section 33 to execute a latch operation by setting the latch circuits L_0 to L_7 of the latch section 33 in the disable state. That is, the latch control section 32 causes the latch section 33 to execute the latch operation at the third timing determined by a gradient (the current value Iconst of Formula (1)) of a voltage change of the second comparison signal CO_2 after the second timing and the circuit threshold value of the latch control section 32.

As described above, before the second timing, a current flows through a path passing through the transistor P8 and the transistor N9 from the power supply VDD to the ground GND. In addition, after the second timing, a current flows through a path passing through the transistor P8 and the output load CL from the power supply VDD to the ground GND. Before and after the second timing, the current flowing through the transistor P8 is substantially the same. That is, before and after the second timing, substantially the same current flows from the power supply VDD to the ground GND. Thereby, it is possible to reduce a change in the current flowing between the power supply VDD and the ground GND. Thus, it is possible to limit bounces of the power supply VDD and the ground GND.

In addition, the current flowing from the power supply VDD to the ground GND in the second amplifier section AMP2 is sufficiently lower than the through-current flowing through the inverter circuit. More specifically, this current is less than or equal to a sum of the current flowing between the drain and the source of the transistor N1 and the current flowing between the drain and the source of the transistor N2. Thus, it is possible to limit bounces of the power supply VDD and the ground GND.

When the bounce of the power supply VDD or the ground GND occurs, the voltage of the output load CL changes. When the voltage of the output load CL changes due to the bounce of the power supply VDD or the ground GND, a time until the voltage of the output load CL reaches the circuit threshold value of the subsequent stage circuit (latch control section 32) changes and the third timing changes. As described above, it is possible to limit a change in the third timing because it is possible to limit the occurrence of the bounces of the power supply VDD and the ground GND in this embodiment. Accordingly, it is possible to limit the degradation of AD conversion precision.

As described above, before and after the second timing, substantially the same current flows from the power supply VDD to the ground GND. However, when the time has elapsed from the second timing, the charging of the output load CL is completed and no current flows. When the charging of the output load CL is completed substantially simultaneously in a large number of columns, the current of the second comparison signal CO_2 becomes 0 substantially simultaneously in a large number of columns. Accordingly, the bounce is likely to occur in the power supply VDD or the ground GND.

However, this current is less than or equal to a sum of the current between the drain and the source of the transistor N1 and the current between the drain and the source of the transistor N2. That is, the current flowing from the power supply VDD to the ground GND is small. Thus, it is possible to limit the occurrence of the bounces of the power supply VDD and the ground GND because the current of the second comparison signal CO_2 becomes 0 substantially simultaneously in a large number of columns.

Figure 6:
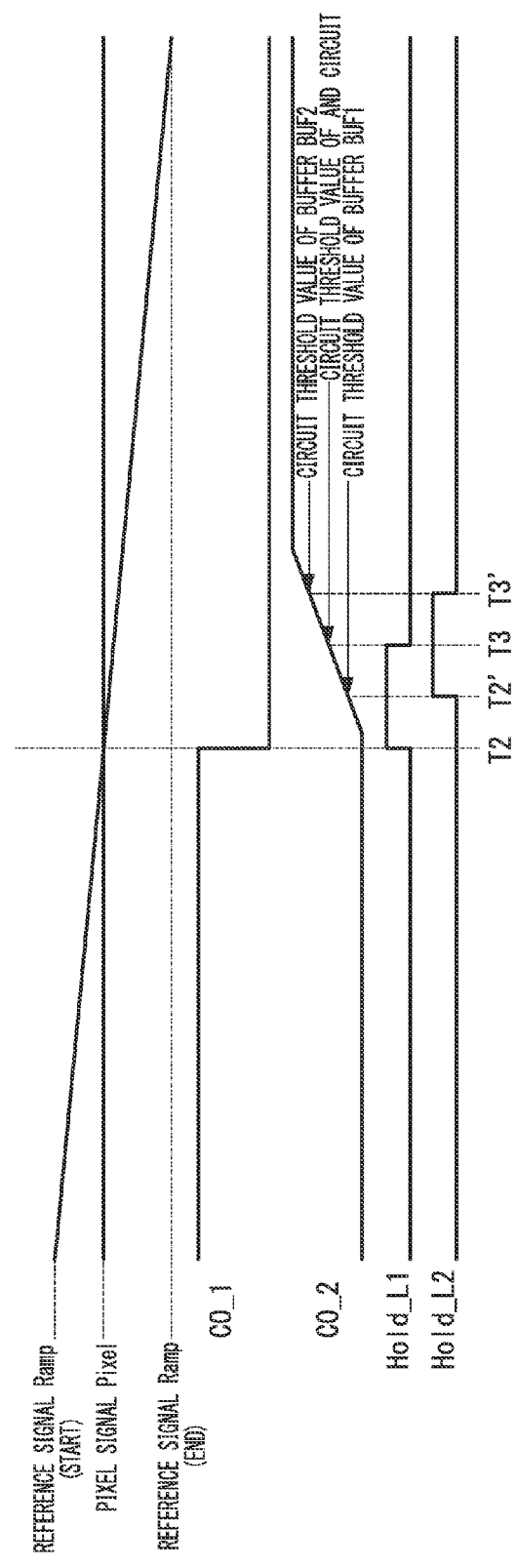
FIG. 6 is a timing chart showing waveforms of signals related to an operation of the latch control section provided in the solid-state imaging apparatus according to the first embodiment of the present invention.

Next, an operation of the latch control section 32 will be described. FIG. 6 shows waveforms of signals related to the operation of the latch control section 32. In FIG. 6, waveforms of the reference signal Ramp, the pixel signal Pixel, the first comparison signal CO_1, the second comparison signal CO_2, the control signal Hold_L1, and the control signal Hold_L2 are shown. The horizontal direction of FIG. 6 represents time and the vertical direction of FIG. 6 represents a voltage. However, signals other than the reference signal Ramp and the pixel signal Pixel are enlarged in the time direction around the second timing T2.

The voltage of the reference signal Ramp when the comparison process starts and the voltage of the reference signal Ramp when the comparison process ends are indicated by dashed lines. In FIG. 6, the voltage of the reference signal Ramp decreases with the passage of time.

Before the second timing T2, the voltage of the reference signal Ramp is greater than the voltage of the pixel signal Pixel. In this case, the voltage of the first comparison signal CO_1 becomes the H level and the voltage of the second comparison signal CO_2 becomes the L level.

At the second timing T2, the voltage of the reference signal Ramp coincides with the voltage of the pixel signal Pixel. After the second timing T2, the voltage of the reference signal Ramp is less than the voltage of the pixel signal Pixel. The voltage of the first comparison signal CO_1 changes from the H level to the L level at the second timing T2. As shown in the aforementioned Formula (1), the voltage of the second comparison signal CO_2 linearly increases at a gradient based on a current value output by the transistor P8 after the second timing T2. Thereafter, the voltage of the second comparison signal CO_2 becomes a constant voltage.

The operation of the latch control section 32 when the configuration of the latch control section 32 is the configuration of FIG. 3A will be described. Because the voltage of the first comparison signal CO_1 becomes the H level and the voltage of the second comparison signal CO_2 becomes the L level before the second timing T2, the voltage of the control signal Hold_L1 output from the AND circuit AND1 becomes the L level.

Because the voltage of the first comparison signal CO_1 and the voltage of the second comparison signal CO_2 become the L level immediately after the second timing T2, the voltage of the control signal Hold_L1 output from the AND circuit AND1 becomes the H level. Thereafter, the voltage of the second comparison signal CO_2 increases with the passage of time. At the third timing T3 at which the voltage of the second comparison signal CO_2 has reached the circuit threshold value of the AND circuit AND1, the voltage of the second comparison signal CO_2 becomes the H level. At this time, the voltage of the control signal Hold_L1 output from the AND circuit AND1 becomes the L level.

When the configuration of the latch control section 32 is the configuration of FIG. 3A, the latch control section 32 enables the latch section 33 at the second timing T2. In addition, the latch control section 32 causes the latch section 33 to execute the latch operation at the third timing T3 at which the time based on the current output from the transistor P8 has elapsed from the second timing T2. A time from the second timing T2 to the third timing T3 is a time based on a gradient of a voltage change of the second comparison signal CO_2 after the second timing T2, that is, the current output by the transistor P8 and the circuit threshold value of the AND circuit AND1.

The operation of the latch control section 32 when the configuration of the latch control section 32 is the configuration of FIG. 3B will be described. In this example, the circuit threshold value of the buffer BUF1 is less than the circuit threshold value of the AND circuit AND2. In addition, the circuit threshold value of the buffer BUF2 is greater than the circuit threshold value of the AND circuit AND2. Because the voltage of the second comparison signal CO_2 becomes the L level before the second timing T2, the voltage of the control signal Hold_L2 output from the AND circuit AND2 becomes the L level.

After the second timing T2, the voltage of the second comparison signal CO_2 increases with the passage of time. At the second timing T2' at which the voltage of the second comparison signal CO_2 has reached the circuit threshold value of the buffer BUF1, the voltage of the second comparison signal CO_2 output from the buffer BUF1 becomes the H level. At this time, the control signal Hold_L2 output from the AND circuit AND2 becomes the H level. The second timing T2' is the timing at which the voltage of the second comparison signal CO_2 input to the latch control section 32 is changed by a voltage change of the first comparison signal CO_1 at the second timing T2. Thus, the second timing T2' becomes the timing corresponding to the second timing T2.

After the second timing T2', the voltage of the second comparison signal CO_2 output from the buffer BUF2 becomes the H level at the third timing T3' at which the voltage of the second comparison signal CO_2 has reached the circuit threshold value of the buffer BUF2. At this time, the voltage of the control signal Hold_L2 output from the AND circuit AND2 becomes the L level.

When the configuration of the latch control section 32 is the configuration of FIG. 3B, the latch control section 32 enables the latch section 33 at the second timing T2'. In addition, the latch control section 32 causes the latch section 33 to execute the latch operation at the third timing T3' at which the time based on the current output from the transistor P8 has elapsed from the second timing T2'. A time from the second timing T2' to the third timing T3' is a time determined according to a gradient of a voltage change of the second comparison signal CO_2 after the second timing T2', that is, the current output by the transistor P8, the circuit threshold value of the AND circuit AND2, the circuit threshold value of the buffer BUF1, and the circuit threshold value of the buffer BUF2.

Next, a difference between operations of the first column and the second column will be described. As described above, a first reference voltage Vb1 is supplied to the comparison section 31 of the first column. In addition, a second reference voltage Vb2 different from the first reference voltage Vb1 is supplied to the comparison section 31 of the second column. In this example, the first reference voltage Vb1 is greater than the second reference voltage Vb2. The first reference voltage Vb1 and the second reference voltage Vb2 are input to the gate of the transistor P8 of the comparison section 31 of each column. A current determined according to each of the first reference voltage Vb1 and the second reference voltage Vb2 input to the gate of the transistor P8 is output from the drain of the transistor P8.

That is, the transistor P8 of the comparison section 31 to which the pixel signal Pixel output from the unit pixel 3 is input in the first column outputs a first current. In addition, the transistor P8 of the comparison section 31 to which the pixel signal Pixel output from the unit pixel 3 is input in the second column outputs a second current having a different current value than the first current.

When the first reference voltage Vb1 is greater than the second reference voltage Vb2, the current output from the transistor P8 of the first column is greater than the current output from the transistor P8 of the second column. That is, the current value of the first current is greater than the current value of the second current. As shown in the above-described Formula (1), a gradient of the voltage change of the second comparison signal CO_2 is greater when the current output from the transistor P8 is greater. Thus, the gradient of the voltage change of the second comparison signal CO_2 output from the comparison section 31 of the first column is greater than the gradient of the voltage change of the second comparison signal CO_2 output from the comparison section 31 of the second column.

Figure 7:
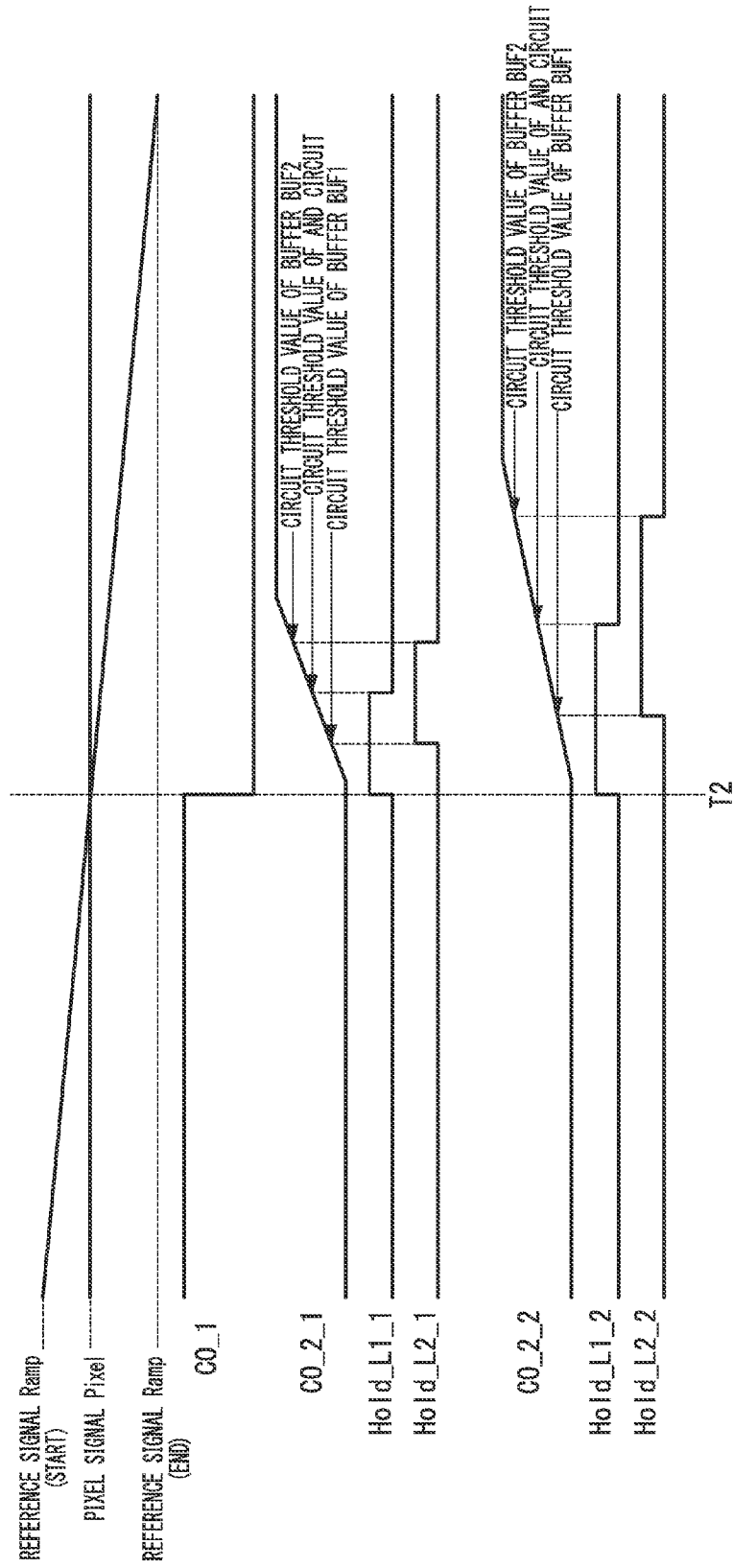
FIG. 7 is a timing chart showing waveforms of signals related to an operation of the latch control section provided in the solid-state imaging apparatus according to the first embodiment of the present invention.

FIG. 7 shows waveforms of signals related to the operation of the latch control section 32. In FIG. 7, waveforms of the reference signal Ramp, the pixel signal Pixel, the comparison signal output from the comparison section 31, and the control signal output from the latch control section 32 are shown. The comparison signal output from the comparison section 31 includes the first comparison signal CO_1, a second comparison signal CO_2_1 output from the comparison section 31 of the first column, and a second comparison signal CO_2_2 output from the comparison section 31 of the second column. The control signal output from the latch control section 32 includes a control signal Hold_L1_1 output from the AND circuit AND1 of the latch control section 32 of the first column, a control signal Hold_L2_1 output from the AND circuit AND2 of the latch control section 32 of the first column, a control signal Hold_L1_2 output from the AND circuit AND1 of the latch control section 32 of the second column, and a control signal Hold_L2_2 output from the AND circuit AND2 of the latch control section 32 of the second column. The horizontal direction of FIG. 7 represents time and the vertical direction of FIG. 7 represents a voltage. However, signals other than the reference signal Ramp and the pixel signal Pixel are enlarged in the time direction around the second timing T2.

In this example, the first reference voltage Vb1 is greater than the second reference voltage Vb2. Thus, the gradient of the voltage change of the second comparison signal CO_2_1 is greater than the gradient of the voltage change of the second comparison signal CO_2_2.

Since a difference in the aforementioned gradient, the timing at which the voltage of the control signal output from the latch control section 32 changes is different between the first column and the second column. When the configuration of the latch control section 32 is the configuration of FIG. 3A, the voltage of the control signal Hold_L1_1 and the voltage of the control signal Hold_L1_2 simultaneously change from the L level to the H level at the second timing T2 at which the voltage of the first comparison signal CO_1 changes from the H level to the L level.

In addition, the voltage of the control signal Hold_L1_1 and the voltage of the control signal Hold_L1_2 change from the H level to the L level at the timing at which the voltage of each of the second comparison signal CO_2_1 and the second comparison signal CO_2_2 has reached the circuit threshold value of the AND circuit AND1. Because the gradient of the voltage change of the second comparison signal CO_2_1 is greater than the gradient of the voltage change of the second comparison signal CO_2_2, the voltage of the control signal Hold_L1_1 first changes from the H level to the L level before the voltage of the control signal Hold_L1_2 changes from the H level to the L level. Thus, the latch section 33 of the first column first performs the latch operation before the latch section 33 of the second column performs the latch operation.

When the configuration of the latch control section 32 is the configuration of FIG. 3B, the voltage of the control signal Hold_L2_1 and the voltage of the control signal Hold_L2_2 change from the L level to the H level at the timing at which each of the voltage of the second comparison signal CO_2_1 and the voltage of the second comparison signal CO_2_2 has reached the circuit threshold value of the buffer BUF1 after the second timing T2 at which the voltage of the first comparison signal CO_1 changes from the H level to the L level. Because the gradient of the voltage change of the second comparison signal CO_2_1 is greater than the gradient of the voltage change of the second comparison signal CO_2_2, the voltage of the control signal Hold_L2_1 first changes from the L level to the H level before the voltage of the control signal Hold_L2_2 changes from the L level to the H level.

In addition, the voltage of the control signal Hold_L2_1 and the voltage of the control signal Hold_L2_2 change from the H level to the L level at the timing at which the voltage of each of the second comparison signal CO_2_1 and the second comparison signal CO_2_2 has reached the circuit threshold value of the buffer BUF2. Because the gradient of the voltage change of the second comparison signal CO_2_1 is greater than the gradient of the voltage change of the second comparison signal CO_2_2, the voltage of the control signal Hold_L2_1 first changes from the H level to the L level before the voltage of the control signal Hold_L2_2 changes from the H level to the L level. Thus, the latch section 33 of the first column first performs the latch operation before the latch section 33 of the second column performs the latch operation.

As described above, the current of the second comparison signal CO_2 becomes 0 substantially simultaneously in a large number of columns, the bounce is likely to occur in the power supply VDD or the ground GND. However, it is possible to limit the bounces of the power supply VDD and the ground GND as will be described below.

When pixel signals Pixel becoming the same level are input to the comparison section 31 of the first column and the comparison section 31 of the second column, the second timing is the same between the first column and the second column. However, the gradient of the voltage change of the second comparison signal CO_2 output from the comparison section 31 is different between the first column and the second column. Thus, the timing at which the charging of the output load CL is completed is different between the first column and the second column. That is, the timing at which the current of the second comparison signal CO_2 becomes 0 is different between the first column and the second column. Thereby, it is possible to limit the bounces of the power supply VDD and the ground GND. That is, it is possible to limit the degradation of AD conversion precision due to the bounces of the power supply VDD and the ground GND.

Instead of supplying different levels of the reference voltages Vb comparing to the first column and the second column, to the gates of the transistors P8 of the comparison sections 31, the same level of the reference voltage Vb comparing to the first column and the second column may be supplied to the gates of the transistors P8 of the comparison sections 31. In this case, it is desirable that the size of the transistor P8 of the first column be larger than the size of the transistor P8 of the second column. Thereby, the current output from the transistor P8 of the first column is larger than the current output from the transistor P8 of the second column. Accordingly, it is possible to limit the bounces of the power supply VDD and the ground GND.

In the first column and the second column, the degradation of AD conversion precision is likely to be caused by a difference in the timing at which the latch section 33 performs the latch operation. For example, when the pixel signals Pixel with the same level have been input to the comparison section 31 of the first column and the comparison section 31 of the second column, because the latch timing is different between the first column and the second column, different digital data is likely to be obtained in the first column and the second column. That is, an error is likely to occur in the digital data.

It is possible to reduce an error of digital data by performing an appropriate operation. As shown in the aforementioned Formula (1), the gradient of the voltage change of the second comparison signal CO_2 does not depend upon the voltage of the pixel signal. Thus, when an error is included in a plurality of pieces of digital data obtained by the column AD conversion section 16 of the same column, the error is substantially constant among the plurality of pieces of digital data regardless of the voltage of the pixel signal.

In relation to the digital data obtained by the column AD conversion section 16 of the same column, an error included in the digital data generated according to the reset level is substantially the same as an error included in the digital data generated according to the signal level. Thus, it is possible to eliminate the error by performing subtraction on the digital data generated according to the reset level, that is, a first level, and the digital data generated according to the signal level, that is, a second level, in relation to digital data based on logic states of a plurality of phase signals latched by the latch section 33 of the same column in the array of the plurality of unit pixels 3. The output section 17 may perform this operation.

In addition, when any unit pixel 3 is a shielded optical black pixel in the array of the plurality of unit pixels 3, it is possible to eliminate an error using digital data obtained from the pixel signal output from the optical black pixel. For example, it is possible to eliminate the error by performing subtraction on the digital data obtained from the pixel signal output from the unit pixel 3 excluding the optical black pixel and the digital data obtained from the pixel signal output from the optical black pixel in relation to digital data based on logic states of a plurality of phase signals latched by the latch section 33 of the same column in the array of the plurality of unit pixels 3. The output section 17 may perform this operation.

The reference voltage Vb may be the same in all columns. Even in this case, in the comparison section 31, substantially the same current flows from the power supply VDD to the ground GND before and after the second timing. Thereby, it is possible to limit the noise of the power supply VDD and bounce of the ground GND as described above. However, for the above-described reason, it is desirable to use reference voltages Vb which can be supplied with different levels.

Figure 8:
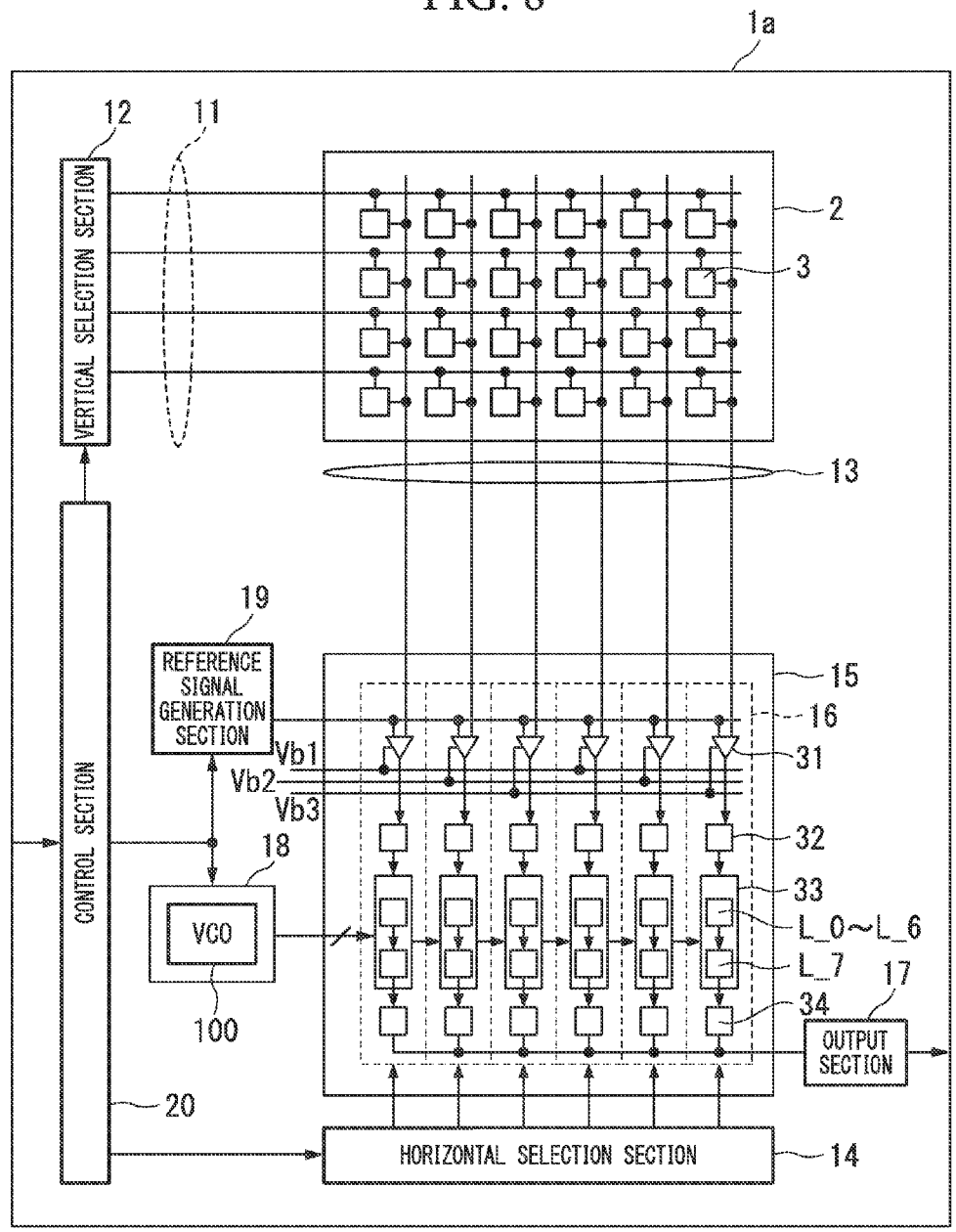
FIG. 8 is a block diagram showing a configuration of the solid-state imaging apparatus according to the first embodiment of the present invention.

For example, a first reference voltage Vb1 and a second reference voltage Vb2 which can be supplied with different levels from each other may be used. FIG. 8 shows a configuration of a solid-state imaging apparatus 1a which is a modified example of the solid-state imaging apparatus 1 shown in FIG. 1. In the solid-state imaging apparatus 1a, a column in the array of the plurality of unit pixels 3 is classified as any one of a plurality of columns including a first column, a second column, and a third column. In the solid-state imaging apparatus 1a, first and fourth columns are first columns, second and fifth columns are second columns, and third and sixth columns are third columns.

A different reference voltage Vb is supplied to each of the comparison sections 31 of the plurality of columns including the first column, the second column, and the third column. In the solid-state imaging apparatus 1a, a first reference voltage Vb1 is supplied to the comparison section 31 of the first column. In addition, a second reference voltage Vb2 different from the first reference voltage Vb1 is supplied to the comparison section 31 of the second column. In addition, a third reference voltage Vb3 different from the first reference voltage Vb1 and the second reference voltage Vb2 is supplied to the comparison section 31 of the third column. Except for the above, the configuration of the solid-state imaging apparatus 1a is similar to the configuration of the solid-state imaging apparatus 1.

When the levels of pixel signals output from the unit pixels 3 of a plurality of different unit pixels 3 in the array of the plurality of unit pixels 3 are close to each other, the second timing tends to be identical in these columns. Thus, it is desirable to shift the timing at which the currents of the second comparison signals CO_2 become 0 in these columns. As described above, it is possible to change the timing at which the currents of the second comparison signals CO_2 become 0 in the first column and the second column by supplying different levels of reference voltages to the comparison sections 31 in the first column and the second column. Thus, it is desirable that a plurality of columns from which pixel signals having levels close to each other are output include the first column and the second column.

For the above reason, it is desirable that the first column and the second column are switched in the row direction in the array of the plurality of unit pixels 3 according to a change in the pixel signal of the row direction in the array of the plurality of unit pixels 3. In a column disposed in a region corresponding to one half or less of the cycle of the change in the pixel signal of the row direction in the array of the plurality of unit pixels 3, levels of pixel signals are likely to be close to each other. Accordingly, it is desirable that the first column and the second column be disposed in the region corresponding to one half or less of the cycle of the change in the pixel signal of the row direction in the array of the plurality of unit pixels 3.

For example, when a region including four continuous columns corresponds to one cycle of the change of the pixel signal of the row direction in the array of the plurality of unit pixels 3, it is desirable to configure four columns by alternately disposing first columns, each of which is formed by one column, and second columns, each of which is formed by one column, in the row direction two by two. In addition, for example, when a region including eight continuous columns corresponds to one cycle of the change of the pixel signal of the row direction in the array of the plurality of unit pixels 3, it is desirable to configure eight columns by alternately disposing first columns, each of which is formed by two columns, and second columns, each of which is formed by two columns, in the row direction four by four. Alternatively, when a region including eight continuous columns corresponds to one cycle of the change of the pixel signal of the row direction in the array of the plurality of unit pixels 3, eight columns may be configured by alternately disposing first columns, each of which is formed by one column, and second columns, each of which is formed by one column, in the row direction four by four.

It is possible to avoid the case in which the currents of the second comparison signals CO_2 simultaneously become 0 in the comparison sections 31 of the plurality of columns from which pixel signals having levels close to each other have been output by disposing the first column and the second column as described above. Accordingly, it is possible to limit the bounces of the power supply VDD and the ground GND.

The cycle of the change in the pixel signal of the row direction in the array of the plurality of unit pixels 3 may be a cycle corresponding to a resolvable maximum spatial frequency (cycle/mm) determined by a modulation transfer function (MTF) which is a spatial frequency characteristic of an optical system, that is, a lens and the solid-state imaging apparatus 1.

In this embodiment, the vertical selection section 12, the horizontal selection section 14, the output section 17, and the control section 20 among components of the solid-state imaging apparatus 1 are not characteristic components of the tdcSS type AD conversion circuit. In addition, these components are not essential components for obtaining the characteristic effects of the solid-state imaging apparatus 1 according to this embodiment. In addition, the count section 34 is not an essential component for obtaining the characteristic effects of the solid-state imaging apparatus 1 according to this embodiment.

According to this embodiment, the solid-state imaging apparatus 1 includes: the imaging section 2 in which a plurality of pixels (unit pixels 3), each of which has a photoelectric conversion element, are disposed in a matrix; the clock generation section 18 configured to generate a plurality of phase signals having different phases from each other; the reference signal generation section 19 configured to generate a reference signal which increases or decreases with the passage of time; the comparison section 31 disposed corresponding to a column in an array of the plurality of pixels and configured to start a comparison process on a pixel signal output from the pixel and the reference signal at a first timing and end the comparison process at a second timing at which the reference signal has satisfied a predetermined condition with respect to the pixel signal; the latch section 33 disposed corresponding to the comparison section 31 and configured to latch logic states of the plurality of phase signals; and the latch control section 32 disposed corresponding to the comparison section 31 and configured to enable the latch section 33 at the second timing and cause the latch section 33 to execute a latch operation at a third timing at which a time based on a current output from the comparison section 31 has elapsed, wherein the comparison section 31 includes the differential amplifier DAMP having a first transistor (transistor N1) with a gate to which the reference signal is input and a second transistor (transistor N2) with a gate to which the pixel signal is input and configured to output a first comparison signal CO_1 determined according to a result of comparing the reference signal to the pixel signal when the comparison process is executed, a current output element (transistor P8) configured to output a substantially constant current when the comparison process is executed, and a third transistor (transistor N9) having a gate to which the first comparison signal CO_1 is input and a drain and a source between which a current output from the current output element flows before the second timing at which a state of the first comparison signal CO_1 changes and being in an OFF state after the second timing, and wherein the comparison section 31 outputs a second comparison signal CO_2 based on a current output from the current output element after the second timing.

In this embodiment, it is possible to reduce a change in the current flowing between the power supply VDD and the ground GND. Thus, it is possible to limit a change in the third timing. Accordingly, it is possible to limit the degradation of AD conversion precision.

In addition, in this embodiment, the current output element is constituted of the transistor P8 having a gate to which a reference voltage Vb is input. Thereby, it is possible to simplify the configuration of the current output element.

In addition, in this embodiment, the transistor P8 outputs a current less than or equal to a sum of a current flowing between the drain and the source of the transistor N1 and a current flowing between the drain and the source of the transistor N2. Thereby, it is possible to further limit the bounces of the power supply VDD and the ground GND.

In addition, in this embodiment, the transistor P8 of the comparison section 31 of the first column and the transistor P8 of the comparison section 31 of the second column output currents of different levels. Thereby, it is possible to further limit the bounces of the power supply VDD and the ground GND.

In addition, in this embodiment, every two columns of the plurality of the first columns are not adjacent to each other, every two columns of the plurality of the second columns are not adjacent to each other, and one column of the plurality of the first column is adjacent to one column of the plurality of the second columns. Thereby, it is possible to maximize switching between the first column and the second column. Accordingly, it is possible to further limit the bounces of the power supply VDD and the ground GND.

In addition, in this embodiment, the first column and the second column are disposed in a region corresponding to one half of the cycle of the change in the pixel signal of the row direction in the array of the plurality of unit pixels 3. Thereby, it is possible to limit the bounces of the power supply VDD and the ground GND.

Second Embodiment

Figure 9:
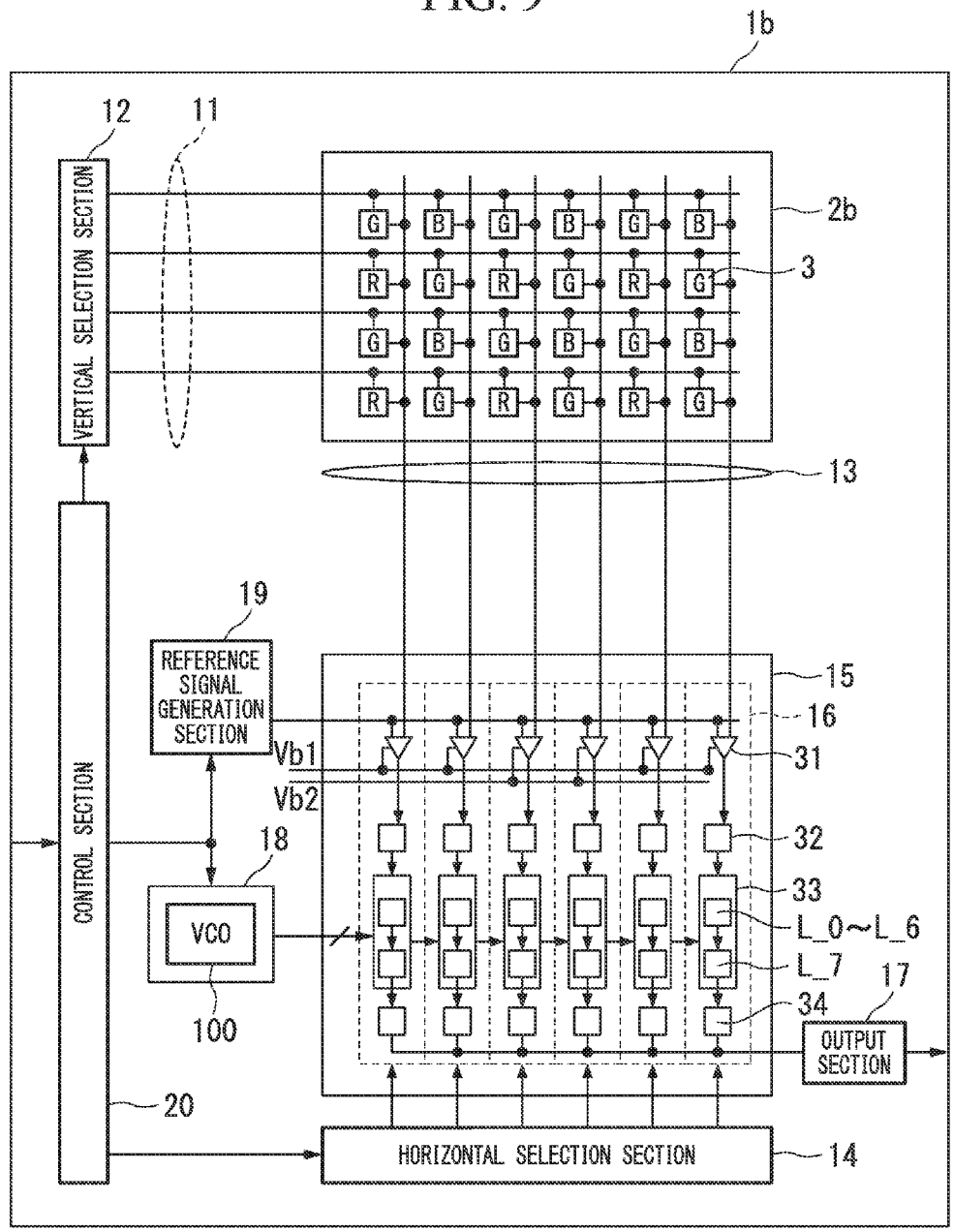
FIG. 9 is a block diagram showing a configuration of a solid-state imaging apparatus according to a second embodiment of the present invention.

Next, the second embodiment of the present invention will be described. FIG. 9 shows an example of a configuration of a solid-state imaging apparatus according to this embodiment.

In the solid-state imaging apparatus 1*b* shown in FIG. 9, a column in the array of the plurality of unit pixels 3 is classified as any one of a plurality of columns including a first column and a second column. In addition, the first column and the second column are constituted of a plurality of continuous columns in the array of the plurality of unit pixels 3. The first column including two columns is disposed for every four columns in the array of the plurality of unit pixels 3. In addition, the second column including two columns is disposed in the center in the array of the plurality of unit pixels 3.

If the number of columns is 8 or more, the second column including two columns is disposed for every four columns in the array of the plurality of unit pixels 3. That is, in the solid-state imaging apparatus in which the column in the array of the plurality of unit pixels 3 is classified as either of the first column and the second column and each of the first column and the second column includes a plurality of continuous columns, one of the plurality of first columns is disposed for every predetermined number of columns in the array of the plurality of unit pixels 3 and one of the plurality of second columns is disposed for every predetermined number of columns in the array of the plurality of unit pixels 3.

A first reference voltage Vb1 is supplied to the comparison section 31 of the first column. In addition, a second reference voltage Vb2 different from the first reference voltage Vb1 is supplied to the comparison section 31 of the second column. For example, the first reference voltage Vb1 is greater than the second reference voltage Vb2.

In the solid-state imaging apparatus 1b, an imaging section 2b is provided in place of the imaging section 2 in the first embodiment. In the imaging section 2b, the array of the plurality of unit pixels 3 is a Bayer array. The Bayer array is an array in which one unit pixel 3 in which an R filter having peak transmittance in R, that is, a red band, is disposed, two unit pixels 3 in which a G filter having peak transmittance in G, that is, a green band, is disposed, and one unit pixel 3 in which a B filter having peak transmittance in B, that is, a blue band, is disposed are designated as a unit array.

In FIG. 9, the unit pixel 3 denoted by "R" is the unit pixel 3 in which the R filter is disposed. Hereinafter, this unit pixel is referred to as the R pixel. In addition, the unit pixel 3 denoted by "G" is the unit pixel 3 in which the G filter is disposed. Hereinafter, this unit pixel is referred to as the G pixel. In addition, the unit pixel 3 denoted by "B" is the unit pixel 3 in which the B filter is disposed. Hereinafter, this unit pixel is referred to as the B pixel. In addition, two unit pixels 3 in which the same type of filters are disposed are referred to as the same type of unit pixels 3.

In the solid-state imaging apparatus 1b, two reference voltages to be supplied to two comparison sections 31 to which pixel signals output from the same type of two unit pixels 3 having a closest distance disposed in the same row in the array of the plurality of unit pixels 3 are input are different. For example, when attention is paid to the R pixel of the first column and the R pixel of the third column, the first reference voltage Vb1 is supplied to the comparison section 31 corresponding to the R pixel of the first column and the second reference voltage Vb2 is supplied to the comparison section 31 corresponding to the R pixel of the third column. Even for the G and B pixels, likewise, the first reference voltage Vb1 and the second reference voltage Vb2 are supplied to the two comparison sections 31 corresponding to the same type of two unit pixels 3 having a closest distance disposed in the same row. Thereby, in the same type of two unit pixels 3 having the closest distance in the row direction, the timings at which the currents of the second comparison signals CO_2 become 0 are different.

In the same type of two unit pixels 3 having the close distance, a difference in an amount of incident light is small. Thus, when comparison processes on pixel signals output from these two unit pixels 3 are executed by comparison sections 31 of two columns, the difference in the second timing in the comparison sections 31 of the two columns is reduced. In the comparison sections 31 of the two columns to which the same reference voltage is supplied, the currents flow from the power supply VDD to the ground GND substantially simultaneously. Thus, the bounces of the power supply VDD and the ground GND are likely to occur.

As described above, in the solid-state imaging apparatus 1b, different reference voltages are supplied to two comparison sections 31 corresponding to the same type of two unit pixels 3 having the closest distance in the row direction. Thereby, it is possible to limit the bounces of the power supply VDD and the ground GND as compared with when the same reference voltage is supplied to the comparison section 31 of the first column and the comparison section 31 of the second column.

The first column and the second column may include three or more columns continuous in the array of the plurality of unit pixels 3. When the array of the plurality of unit pixels 3 includes a plurality of unit arrays, each of which includes n (n is a natural number greater than or equal to 2) or more continuous columns, it is desirable that the first column and the second column include n columns continuous in the array of the plurality of unit pixels 3.

In this embodiment, the first column and the second column include a plurality of columns continuous in the array of the plurality of unit pixels 3. When the array of the plurality of unit pixels 3 is an array (Bayer array or the like) including a plurality of unit arrays, each of which includes a plurality of columns, it is possible to limit the bounces of the power supply VDD and the ground GND as described above. The array of the plurality of unit pixels 3 may not be the aforementioned array including the plurality of unit arrays. However, when the array of the plurality of unit pixels 3 is the aforementioned array including the plurality of unit arrays, it is possible to further limit the bounces of the power supply VDD and the ground GND.

Third Embodiment

Figure 10:
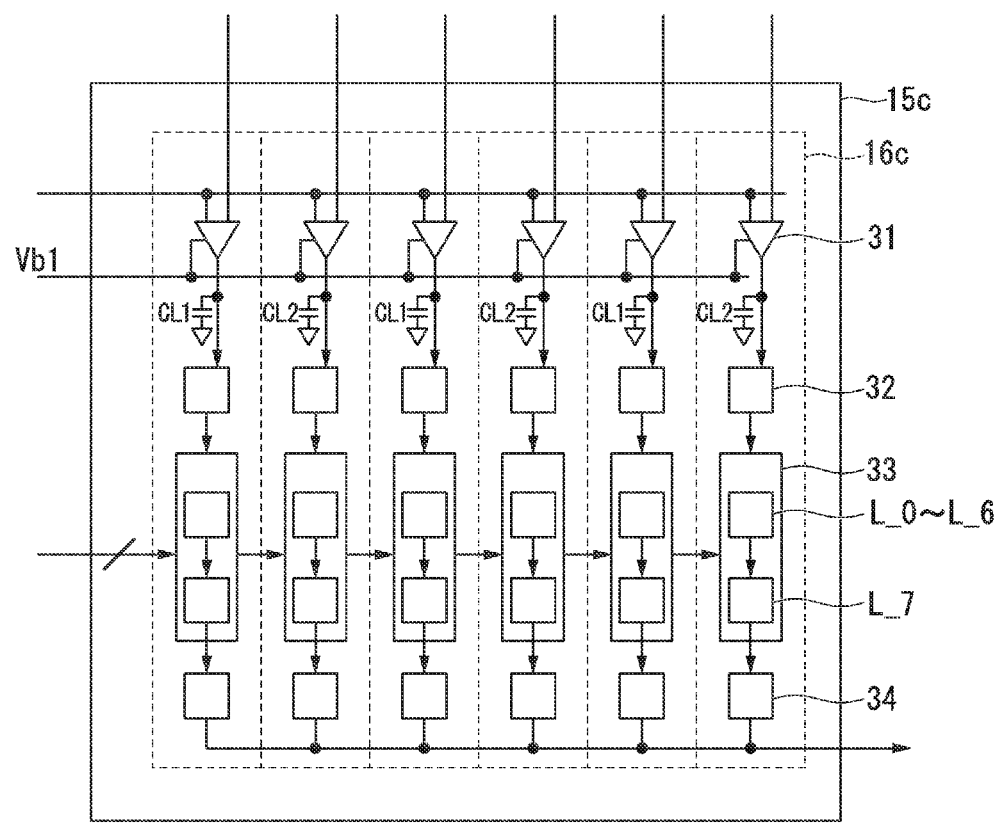
FIG. 10 is a block diagram showing a configuration of a column processing section provided in a solid-state imaging apparatus according to a third embodiment of the present invention.

Next, the third embodiment of the present invention will be described. In a solid-state imaging apparatus according to this embodiment, a column processing section 15c shown in FIG. 10 is provided in place of the column processing section 15 of the solid-state imaging apparatus 1 according to the first embodiment. Components other than the column processing section 15c are similar to those of the solid-state imaging apparatus 1.

In the column processing section 15c, a column AD conversion section 16c is provided in place of the column AD conversion section 16 of the solid-state imaging apparatus 1. In the column processing section 15c, components other than the column AD conversion section 16c are similar to those of the column AD conversion section 16 of the solid-state imaging apparatus 1.

In this embodiment, the same first reference voltage Vb1 is supplied to the comparison sections 31 of the column AD conversion sections 16c of all columns. In addition, in this embodiment, the column in the array of the plurality of unit pixels 3 is classified as any one of a plurality of columns including a first column and a second column. In the solid-state imaging apparatus 1c, an odd-numbered column is the first column and an even-numbered column is the second column. A first load capacitor CL1 corresponding to the comparison section 31 of the first column and a second load capacitor CL2 corresponding to the comparison section 31 of the second column are disposed.

The first load capacitor CL1 is connected to a contact point between the transistor P8 and the transistor N9 of the comparison section 31 to which a pixel signal output from the unit pixel 3 in the first column is input. In addition, the second load capacitor CL2 having a different capacitance value than the first load capacitor CL1 is connected to a contact point between the transistor P8 and the transistor N9 of the comparison section 31 to which a pixel signal output from the unit pixel 3 in the second column is input. For example, the capacitance value of the first load capacitor CL1 is less than the capacitance value of the second load capacitor CL2.

The first load capacitor CL1 and the second load capacitor CL2 may include capacitive elements. In this case, it is desirable to determine the capacitance values of the first load capacitor CL1 and the second load capacitor CL2 in consideration of parasitic capacitance added to wiring, parasitic capacitance added to an input of the latch control section 32, and the like.

As shown in Formula (1), the gradient of the voltage change of the second comparison signal CO_2 changes according to the capacitance value of the output load CL. Because the capacitance value of the first load capacitor CL1 is different from the capacitance value of the second load capacitor CL2, the gradient of the voltage change of the second comparison signal CO_2 output from the comparison section 31 of the first column is different from the gradient of the voltage change of the second comparison signal CO_2 output from the comparison section 31 of the second column. Thereby, it is possible to change the timing at which the current of the second comparison signal CO_2 becomes 0 in the first column and the second column as in the first embodiment. Accordingly, it is possible to further limit the bounces of the power supply VDD and the ground GND.

Figure 11:
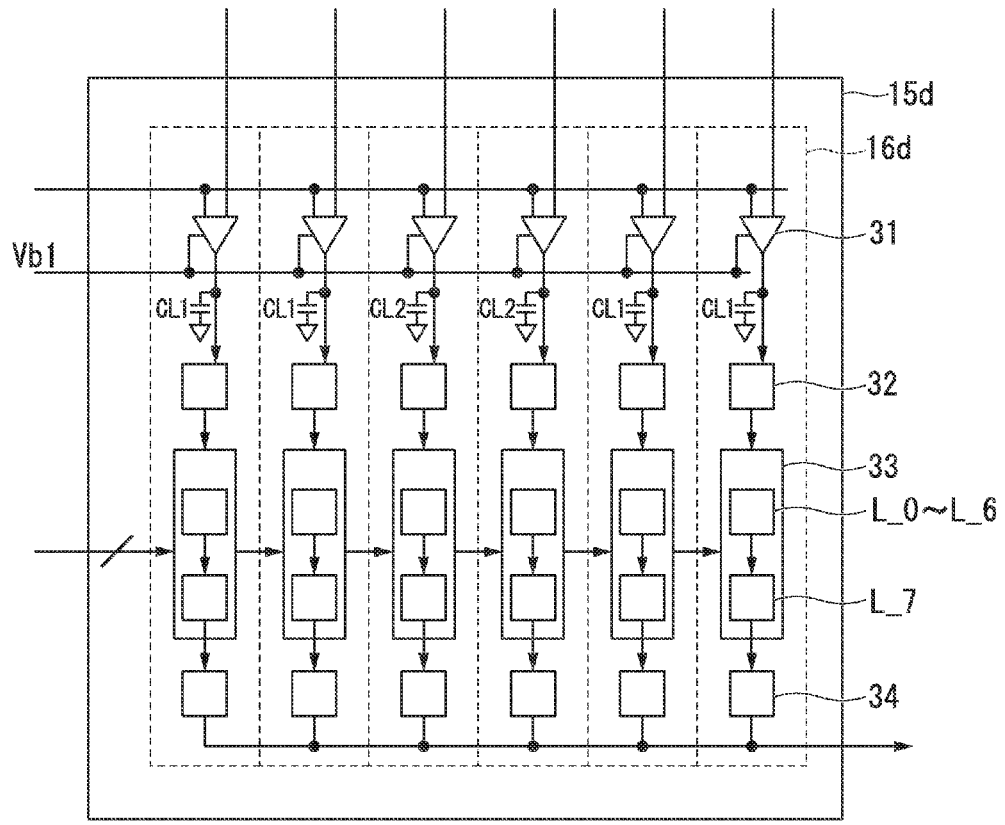
FIG. 11 is a block diagram showing a configuration of the column processing section provided in the solid-state imaging apparatus according to the third embodiment of the present invention.

The column processing section 15c may be the column processing section 15d shown in FIG. 11. In the column processing section 15d, a column AD conversion section 16d is provided in place of the column AD conversion section 16c in the column processing section 15c. In the column processing section 15d, components other than the column AD conversion section 16d are similar to those of the column AD conversion section 16 of the solid-state imaging apparatus 1.

In the solid-state imaging apparatus having the column processing section 15d, the column in the array of the plurality of unit pixels 3 is classified as any one of a plurality of columns including a first column and a second column. In addition, the plurality of first columns and the plurality of second columns may be configured to include a plurality of columns continuous in the array of the plurality of unit pixels 3. Two columns of the plurality of the first columns are disposed for every four columns in the array of the plurality of unit pixels 3. In addition, in the center of the array of the plurality of unit pixels 3, two columns of the plurality of the second column are disposed. The first load capacitor CL1 corresponding to the comparison section 31 of the first column and the second load capacitor CL2 corresponding to the comparison section 31 of the second column are disposed.

In the solid-state imaging apparatus having the column processing section 15d, because the capacitance value of the first load capacitor CL1 is different from the capacitance value of the second load capacitor CL2, the gradient of the voltage change of the second comparison signal CO_2 output from the comparison section 31 of the first column is different from the gradient of the voltage change of the second comparison signal CO_2 output from the comparison section 31 of the second column. Thereby, as in the second embodiment, it is possible to change the timing at which the current of the second comparison signal CO_2 becomes 0 in the first column and the second column. Accordingly, it is possible to further limit the bounces of the power supply VDD and the ground GND.

In the solid-state imaging apparatus having the column processing section 15d, the imaging section 2b of the solid-state imaging apparatus 1b according to the second embodiment may be used in place of the imaging section 2. In this case, it is possible to further limit the bounces of the power supply VDD and the ground GND.

In this embodiment, the first load capacitor CL1 is connected to the comparison section 31 of the first column and the second load capacitor CL2 having a different capacitance value than the first load capacitor CL1 is connected to the comparison section 31 of the second column. Thereby, it is possible to further limit the bounces of the power supply VDD and the ground GND. In addition, because the same first reference voltage Vb1 is supplied to the comparison section 31 of the first column and the comparison section 31 of the second column, it is possible to reduce the number of voltage sources for outputting the reference voltage Vb.

Fourth Embodiment

Figure 12:
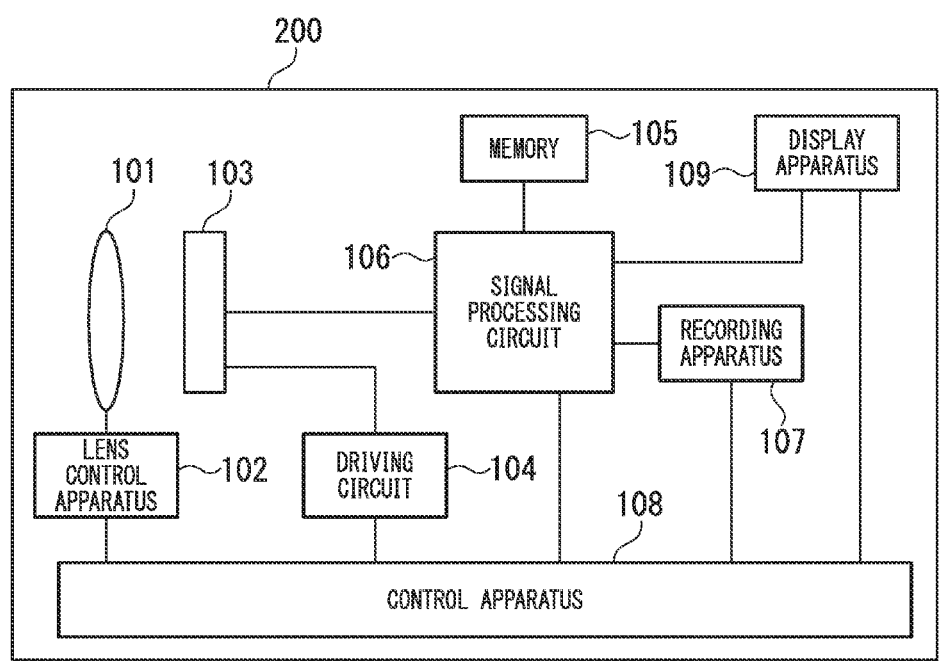
FIG. 12 is a block diagram showing a configuration of an imaging device according to a fourth embodiment of the present invention.
Figure 13:
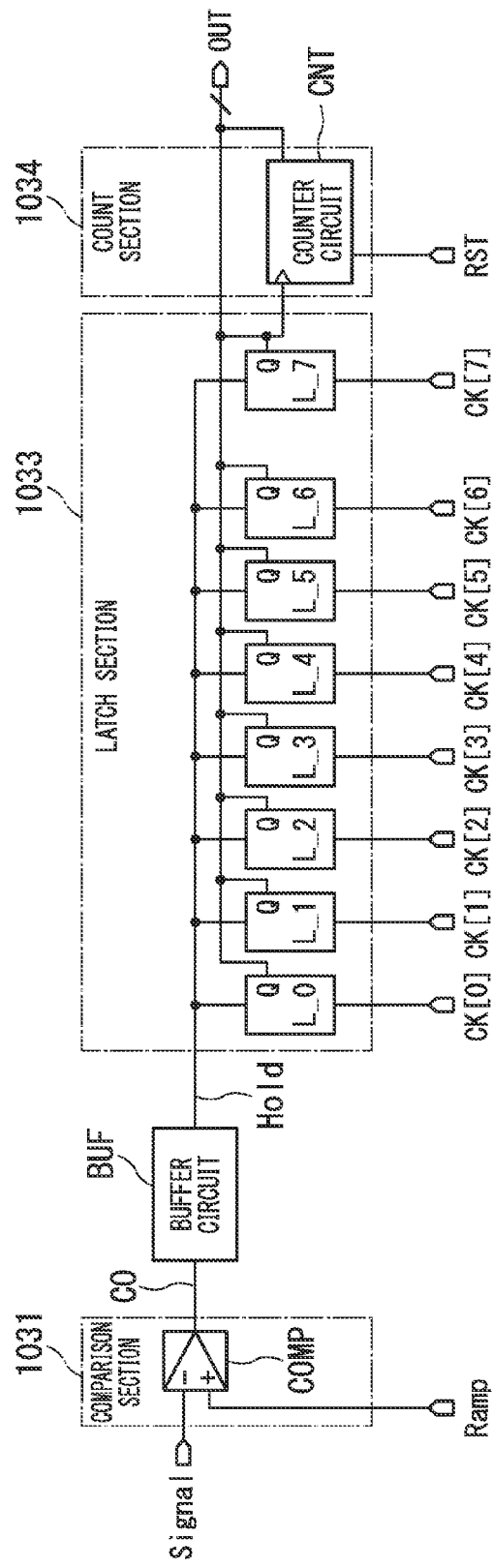
FIG. 13 is a block diagram showing part of a configuration of a tdcSS type AD conversion circuit according to a first conventional example.
Figure 14:
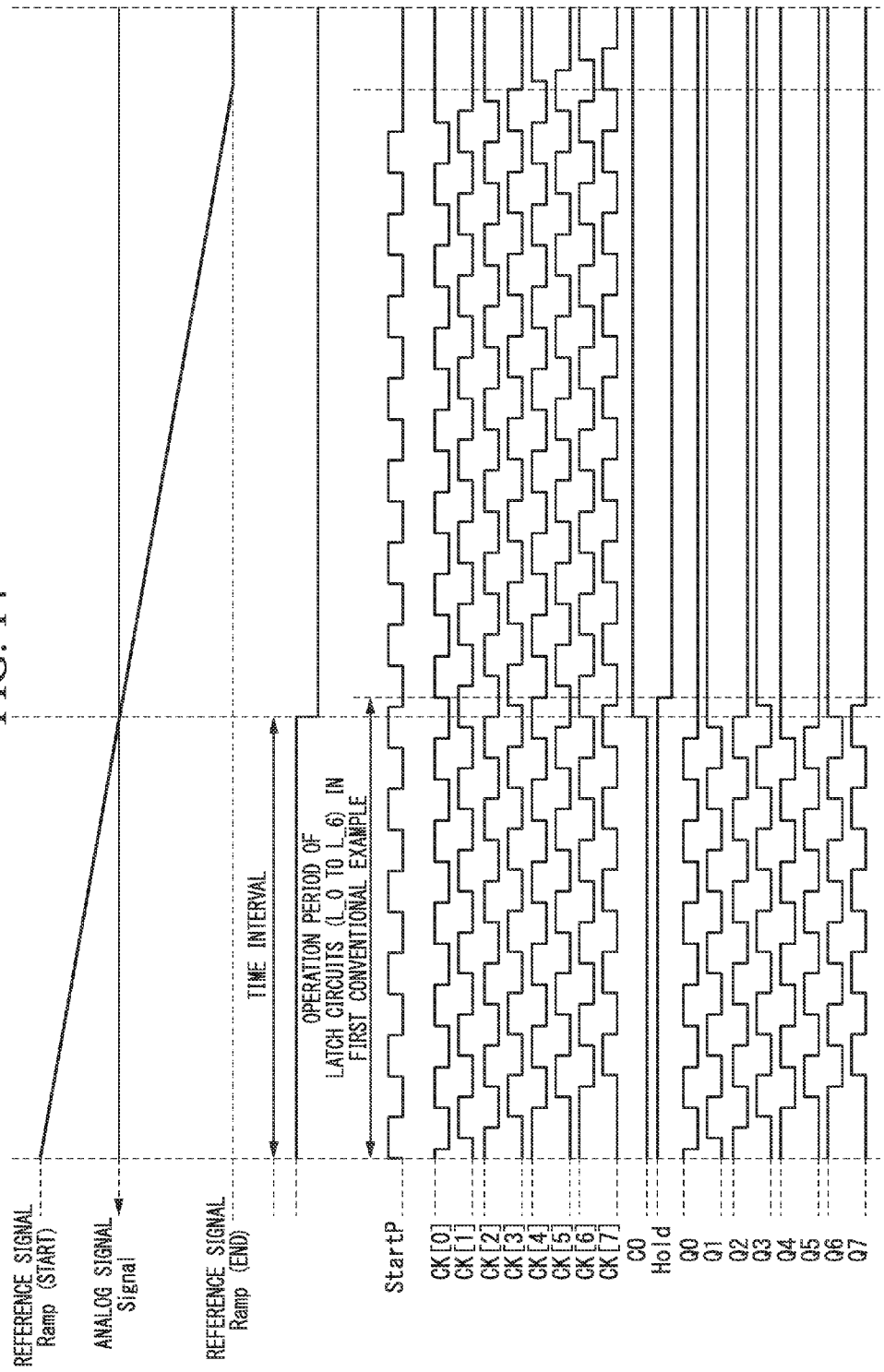
FIG. 14 is a timing chart showing an operation of the tdcSS type AD conversion circuit according to the first conventional example.
Figure 15:
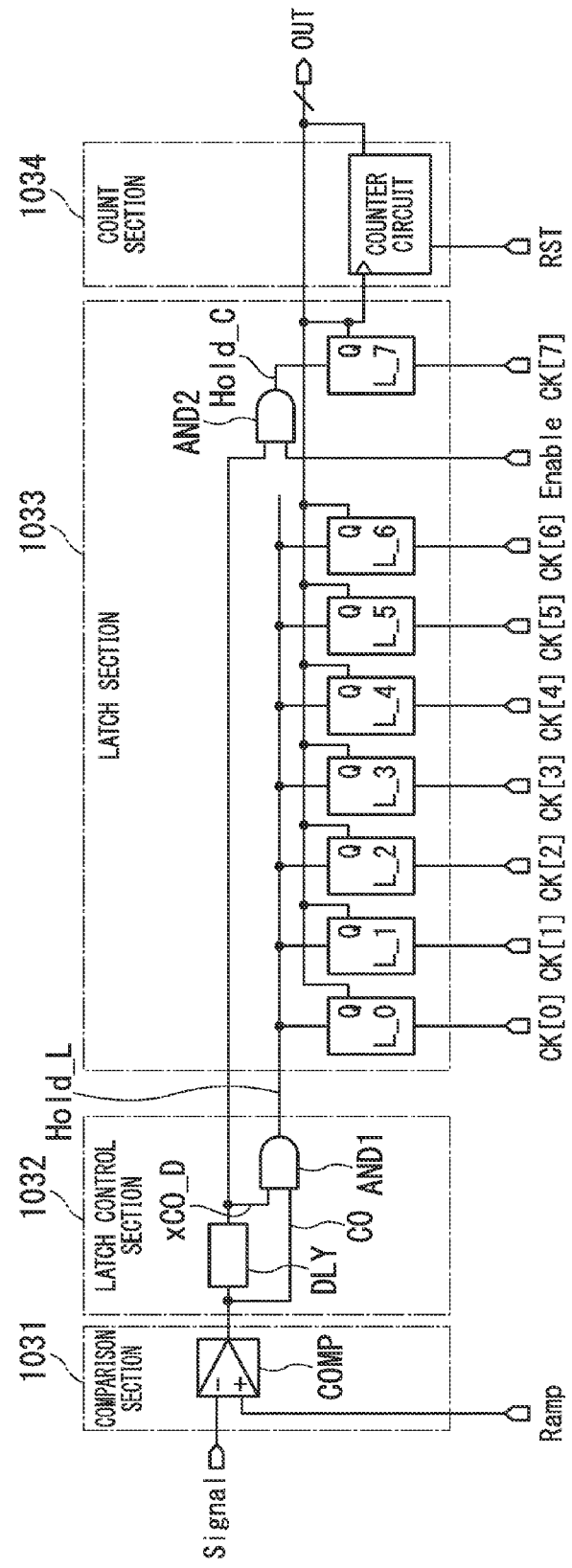
FIG. 15 is a block diagram showing part of a configuration of a tdcSS type AD conversion circuit according to a second conventional example.
Figure 16:
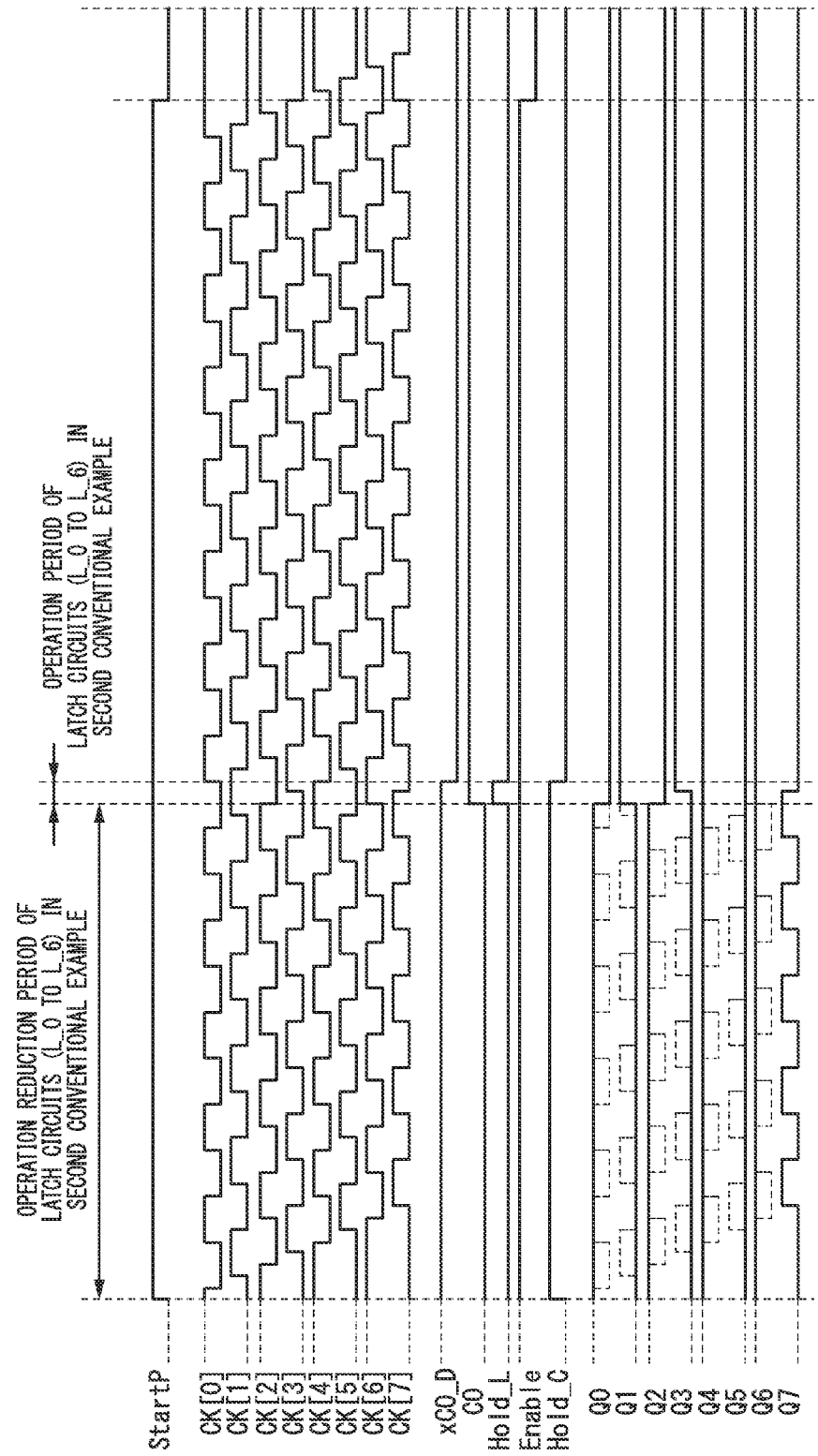
FIG. 16 is a timing chart showing an operation of the tdcSS type AD conversion circuit according to the second conventional example.

Next, the fourth embodiment of the present invention will be described. FIG. 12 shows a configuration of a digital camera which is an example of an imaging device to which the solid-state imaging apparatus according to any one of the first to third embodiments is applied. The imaging device according to this embodiment may be an electronic device having an imaging function or may be a digital video camera, an endoscope, or the like in addition to a digital camera. The digital camera 200 shown in FIG. 12 has a lens section 101, a lens control apparatus 102, a solid-state imaging apparatus 103, a driving circuit 104, a memory 105, a signal processing circuit 106, a recording apparatus 107, a control apparatus 108, and a display apparatus 109.

The lens section 101 includes a zoom lens or a focus lens, and forms an image of light from an object as an object image on a light-receiving plane of the solid-state imaging apparatus 103. The lens control apparatus 102 controls the zoom, focus, aperture, or the like of the lens section 101. The image of light fetched via the lens section 101 is formed on the light-receiving plane of the solid-state imaging apparatus 103. The solid-state imaging apparatus 103 converts the object image formed on the light-receiving plane into digital data, that is, image data, and outputs the digital data, that is, the image data. On the light-receiving plane of the solid-state imaging apparatus 103, a plurality of pixels are two-dimensionally arranged in a row direction and a column direction. The solid-state imaging apparatus 103 is a solid-state imaging apparatus according to any one of the first to third embodiments.

The driving circuit 104 drives the solid-state imaging apparatus 103 and controls its operation. The memory 105 temporarily stores the image data. The signal processing circuit 106 performs a predetermined process on the image data output from the solid-state imaging apparatus 103. The process to be performed by the signal processing circuit 106 is various types of corrections of image data, compression of image data, or the like.

The recording apparatus 107 includes a semiconductor memory for recording or reading image data or the like, and is embedded in the digital camera 200 in a detachable state. The display apparatus 109 performs display of a moving image (live view image), display of a still image, display of a moving image or a still image recorded on the recording apparatus 107, display of a state of the digital camera 200, or the like.

The control apparatus 108 controls the overall digital camera 200. An operation of the control apparatus 108 is defined in a program stored in a read only memory (ROM) embedded in the digital camera 200. The control apparatus 108 reads this program and performs various types of control based on details defined by the program.

According to this embodiment, the imaging device (digital camera 200) characterized in that the solid-state imaging apparatus according to any one of the first to third embodiments is provided is configured.

In this embodiment, as in the first to third embodiments, it is possible to limit the degradation of AD conversion precision.

While preferred embodiments of the invention have been described and shown above, it should be understood that these are exemplary of the invention and are not to be considered as limiting. Additions, omissions, substitutions, and other modifications can be made without departing from the spirit or scope of the present invention. Accordingly, the invention is not to be considered as being limited by the foregoing description, and is only limited by the scope of the appended claims.

What is claimed is:

1. A solid-state imaging apparatus comprising:
an imaging section in which a plurality of pixels, each of which has a photoelectric conversion element, are disposed in a matrix;
a clock generation section configured to generate a plurality of phase signals including different phases from each other;
a reference signal generation section configured to generate a reference signal whose amplitude increases or decreases with the passage of time;
a comparison section disposed corresponding to a column in an array of the plurality of pixels and configured to start a comparison process on a pixel signal output from the pixel and the reference signal at a first timing and end the comparison process at a second timing at which the reference signal has satisfied a predetermined condition with respect to the pixel signal;
a latch section disposed corresponding to the comparison section and configured to latch logic states of the plurality of phase signals; and
a latch control section disposed corresponding to the comparison section and configured to enable the latch section at the second timing and cause the latch section to execute a latch operation at a third timing at which a time based on a current output from the comparison section has elapsed from the second timing,
wherein the comparison section includes
a differential amplifier including a first transistor with a gate to which the reference signal is input and a second transistor with a gate to which the pixel signal is input and configured to output a first comparison signal determined according to a result of comparing the reference signal to the pixel signal when the comparison process is executed,
a current output element configured to output substantially a constant current when the comparison process is executed, and
a third transistor,
wherein the third transistor includes a gate to which the first comparison signal is input,
before the second timing at which a state of the first comparison signal changes, a current output from the current output element flows between a drain and a source, and
after the second timing, the third transistor becomes an OFF state, and
wherein the comparison section outputs a second comparison signal based on the current output from the current output element after the second timing.

2. The solid-state imaging apparatus according to claim 1, wherein the current output element is a fourth transistor including a gate to which a reference voltage is input.

3. The solid-state imaging apparatus according to claim 1, wherein the current output element outputs a current less than or equal to a sum of a current flowing between the drain and the source of the first transistor and a current flowing between the drain and the source of the second transistor.

4. The solid-state imaging apparatus according to claim 1,
wherein a column in the array of the plurality of pixels is classified as one of a plurality of first columns or one of a plurality of second columns,
wherein the current output element of the comparison section to which the pixel signal output from the pixel in the first column is input outputs a first current, and
wherein the current output element of the comparison section to which the pixel signal output from the pixel in the second column is input outputs a second current having a different current value than the first current.

5. The solid-state imaging apparatus according to claim 4, wherein one of the plurality of first columns is disposed for every predetermined number of columns in the array of the plurality of pixels and the one of the plurality of second columns is disposed for every predetermined number of columns in the array of the plurality of pixels.

6. The solid-state imaging apparatus according to claim 5, wherein each of the plurality of first columns and the plurality of second columns is configured of a plurality of columns continuous in the array of the plurality of pixels.

7. The solid-state imaging apparatus according to claim 6, wherein the array of the plurality of pixels is an array including a plurality of unit arrays, each of which is configured of a plurality of continuous columns.

8. The solid-state imaging apparatus according to claim 5,
wherein two columns of the plurality of first columns are not adjacent to each other,
wherein two columns of the plurality of second columns are not adjacent to each other, and
wherein one column of the plurality of first columns is adjacent to one column of the plurality of second columns.

9. The solid-state imaging apparatus according to claim 5, wherein the first and second columns are disposed in a region corresponding to one half or less of a cycle of a change in the pixel signal of the row direction in the array of the plurality of pixels.

10. The solid-state imaging apparatus according to claim 1,
wherein a column in the array of the plurality of pixels is classified as one of a plurality of first columns or one of a plurality of second columns,
wherein a first load capacitor is connected to a contact point between the current output element of the comparison section to which the pixel signal output from the pixel in the first column is input and the third transistor, and
wherein a second load capacitor having a different capacitance value than the first load capacitor is connected to a contact point between the current output element of the comparison section to which the pixel signal output from the pixel in the second column is input and the third transistor.

11. The solid-state imaging apparatus according to claim 10, wherein one of the plurality of first columns is disposed for every predetermined number of columns in the array of the plurality of pixels and the one of the plurality of second columns is disposed for every predetermined number of columns in the array of the plurality of pixels.

12. The solid-state imaging apparatus according to claim 11, wherein each of the plurality of first columns and the plurality of second columns is configured of a plurality of columns continuous in the array of the plurality of pixels.

13. The solid-state imaging apparatus according to claim 12, wherein the array of the plurality of pixels is an array including a plurality of unit arrays, each of which is configured of a plurality of continuous columns.

14. The solid-state imaging apparatus according to claim 11,
wherein two columns of the plurality of first columns are not adjacent to each other,
wherein two columns of the plurality of second columns are not adjacent to each other, and
wherein one column of the plurality of first columns is adjacent to one column of the plurality of second columns.

15. The solid-state imaging apparatus according to claim 11, wherein the first and second columns are disposed in a region corresponding to one half or less of a cycle of a change in the pixel signal of the row direction in the array of the plurality of pixels.

16. An imaging device comprising:
the solid-state imaging apparatus according to claim 1.

* * * * *